(12) United States Patent
Jiang et al.

(10) Patent No.: US 12,414,295 B2
(45) Date of Patent: Sep. 9, 2025

(54) SEMICONDUCTOR MEMORY STRUCTURE AND METHOD FOR FORMING THE SAME

(71) Applicant: TAIWAN SEMICONDUCTOR MANUFACTURING COMPANY LTD., Hsinchu (TW)

(72) Inventors: Yu-Wei Jiang, Hsinchu (TW); Hung-Chang Sun, Kaohsiung (TW); Sheng-Chih Lai, Hsinchu County (TW); Kuo-Chang Chiang, Hsinchu (TW); Tsuching Yang, Taipei (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 446 days.

(21) Appl. No.: 17/461,891

(22) Filed: Aug. 30, 2021

(65) Prior Publication Data

US 2023/0060819 A1    Mar. 2, 2023

(51) Int. Cl.
*H10B 41/27* (2023.01)
*H01L 23/522* (2006.01)
(Continued)

(52) U.S. Cl.
CPC ......... *H10B 43/27* (2023.02); *H01L 23/5226* (2013.01); *H10B 41/10* (2023.02); *H10B 41/27* (2023.02); *H10B 43/10* (2023.02)

(58) Field of Classification Search
CPC .............. H10B 43/20–27; H10B 43/10; H10B 41/00–70; H10B 51/00–50; H10B 12/30; H10B 12/488; H10B 12/00–50; H10B 10/00–18; H10B 20/40–50; H10B 53/00–50; H10B 63/84–845; H10B 69/00; H10B 41/10; H10B 41/27; H10B 51/10; H10B 51/20; H01L 23/5226; H01L 23/538; H01L 23/5386; H01L 2924/1437; H01L 2924/1436–14369; H01L 2924/1451; H01L 27/092–0928; H01L 28/40–92; G11C 8/14; G11C 11/408; G11C 11/41–419; G11C 11/401–4099; G11C 11/5621–5642;
(Continued)

(56) References Cited

U.S. PATENT DOCUMENTS 9,397,043 B1 * 7/2016 Minemura ............. H10B 43/10
2016/0268445 A1 * 9/2016 Amo ................. H01L 29/66833
(Continued)

*Primary Examiner* — David Vu
(74) *Attorney, Agent, or Firm* — WPAT LAW; Anthony King

(57) ABSTRACT

A semiconductor memory structure includes a plurality of gate layers and a plurality of insulating layers alternately stacked over a substrate, and at least an active column disposed over the substrate. The gate layers and the insulating layers are alternately stacked along a first direction. The active column extends along the first direction and penetrates the gate layer and the insulating layer. The active column includes a central portion, a charge-trapping layer surrounding the central portion, and a channel layer between the central portion and the charge-trapping layer. The central portion of the active column includes an isolation structure, a source structure and a drain structure. The source structure and the drain structure are disposed at two sides of the isolation structure.

20 Claims, 27 Drawing Sheets

(51) Int. Cl.
*H10B 41/10* (2023.01)
*H10B 43/10* (2023.01)
*H10B 43/27* (2023.01)

(58) Field of Classification Search
CPC ......... G11C 14/0009–0045; G11C 2211/4016; G11C 16/00–349; G11C 2216/06–10; G11C 2216/12–30
See application file for complete search history.

(56) References Cited

U.S. PATENT DOCUMENTS

2020/0381450 A1\* 12/2020 Lue ........................ H10B 43/27
2021/0408035 A1\* 12/2021 Sato ....................... H10B 41/27
2022/0199639 A1\* 6/2022 Yeh ........................ H10B 41/41

\* cited by examiner

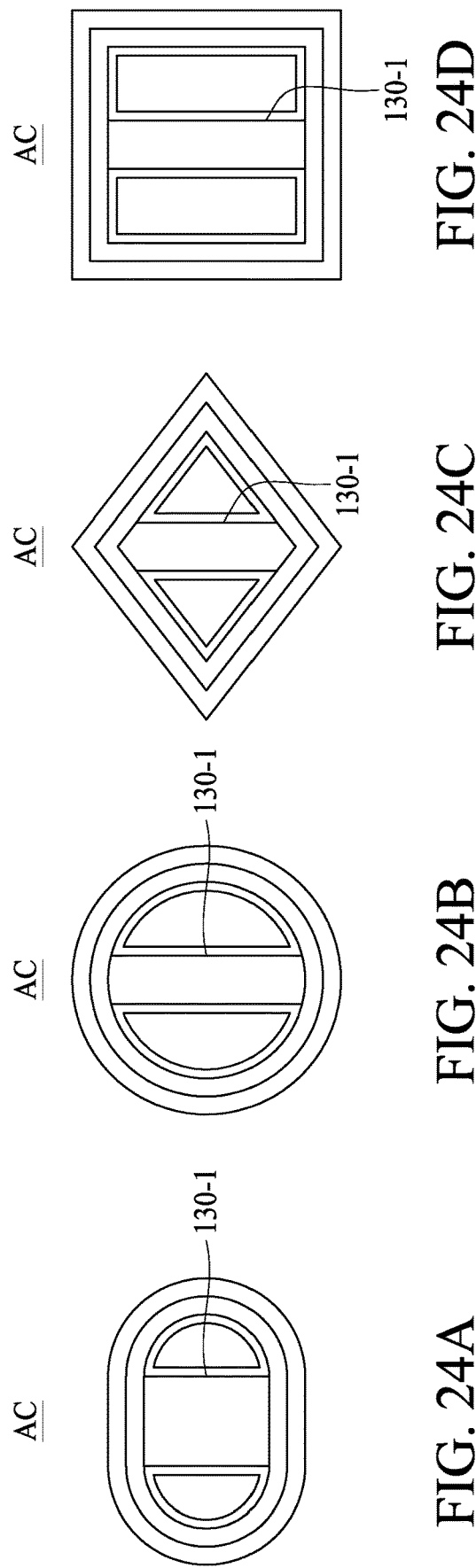

SEMICONDUCTOR MEMORY STRUCTURE AND METHOD FOR FORMING THE SAME

BACKGROUND

Recently, great progress has been achieved in development of semiconductor memory devices. Due to continuously increasing requirements for memory devices with mass capacity, integration density of memory cells in a memory device keeps increasing. Scaling the memory cell size and realizing high-density memory are eagerly needed for various applications such as internet of things (IoT) and mechanism learning. As critical dimensions of devices in integrated circuits shrink to the limits of common memory cell technologies, designers have been looking to techniques for stacking multiple planes of memory cells to achieve greater storage capacity, and to achieve lower costs per bit. A three dimensional (3D) memory array architecture has been realized by stacking several cells in series vertically up on each cell which is located in two dimensional (2D) array matrix. There is a continuous demand to develop improved semiconductor memory structures for satisfying the above requirements.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIGS. 24A to 24D are schematic drawings illustrating shapes of active columns according to aspects of one or more embodiments of the present disclosure.

DETAILED DESCRIPTION

Figure 1:
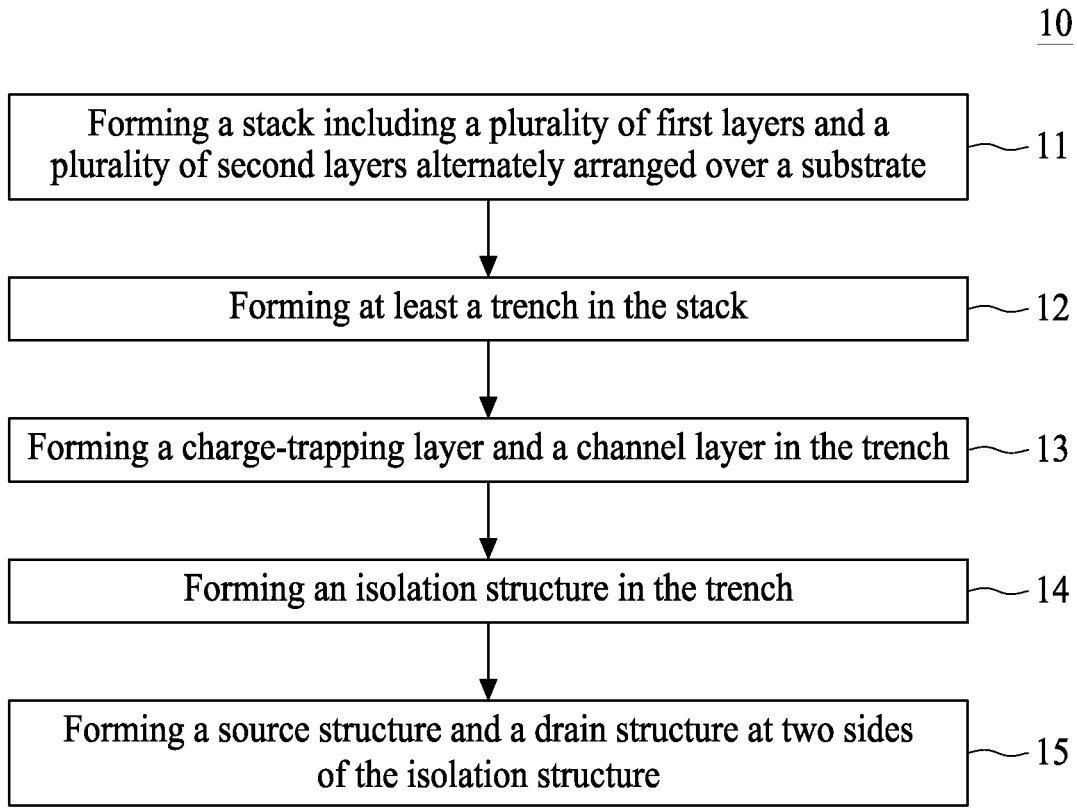
FIG. 1 is a flowchart of a method for forming a semiconductor memory structure according to various aspects of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 100 degrees or at other orientations) and the spatially relative descriptors used herein may likewise be interpreted accordingly.

As used herein, the terms such as "first," "second" and "third" describe various elements, components, regions, layers and/or sections, but these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

Non-volatile memory (NVM) generally refers to any memory or storage that can retain stored data even when no power is applied. Example NVM includes flash memory, and flash memory includes two main types: NAND-type flash memory and NOR-type flash memory. The NAND-type flash memory has an advantage of a high-density structure including a number of storage transistors series-connected to form strings. However, reading and writing the content of any of the series-connected storage transistor requires activation of all series-connected storage transistors in one string, results in slow read/write access speed. Therefore, a memory structure complying with high-speed requirement in AI and high bandwidth memory, and high density requirements is needed.

The present disclosure therefore provides a semiconductor memory structure and a method for forming the same that complies with both the high read/write access speed requirement and the high density requirement. In some embodiments, the semiconductor memory structure in a NOR-type flash memory structure that provides greater read/write access speed as good as a dynamic random access memory (DRAM). Further, the semiconductor memory structure includes a 3D configuration that complies with the high-density requirement as good as NAND-type memory.

FIG. 1 is a flowchart representing a method for forming a semiconductor memory structure 10 according to aspects of the present disclosure. In some embodiments, the method for forming the semiconductor memory structure 10 includes a number of operations (11, 12, 13, 14 and 15). The methods for forming the semiconductor memory structure 10 will be further described according to one or more embodiments. It should be noted that the operations of the methods for forming the semiconductor memory structure 10 may be rearranged or otherwise modified within the scope of the various aspects. It should further be noted that additional processes may be provided before, during, and after the method 10, and that some other processes may be only briefly described herein.

Figure 2A:
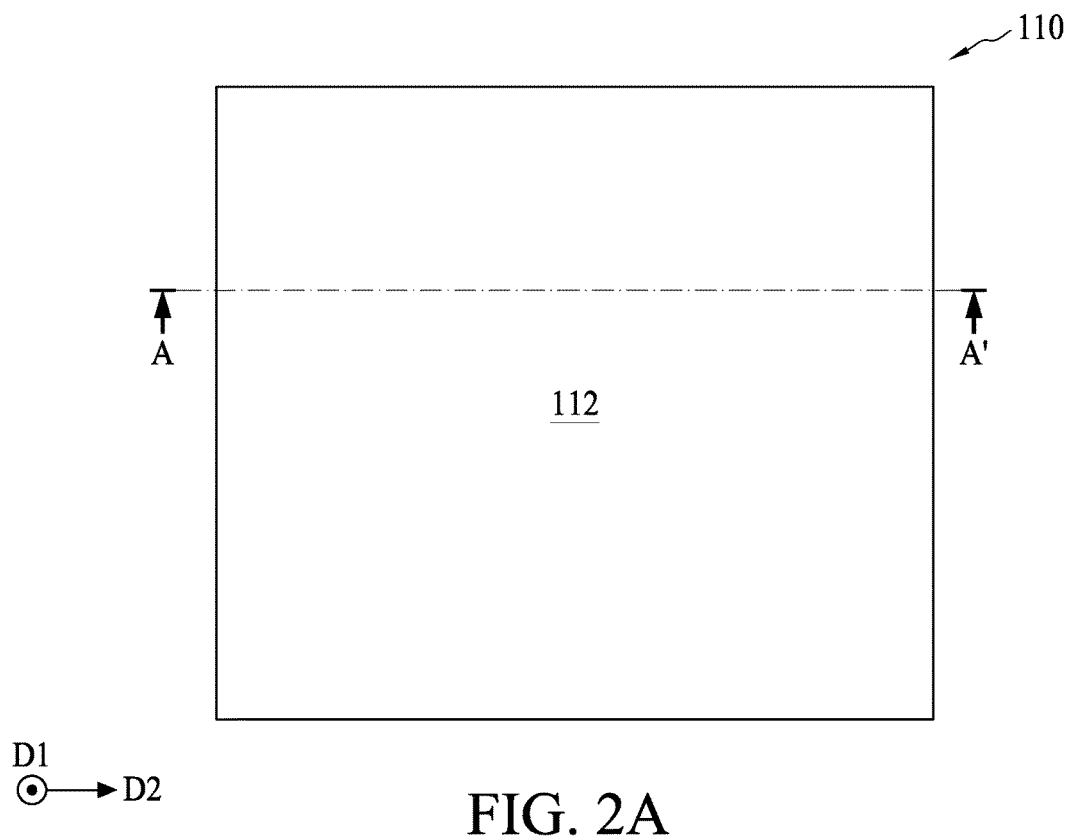
FIGS. 2A, 3A, 4A, 5A, 6A, 7A and 8A are schematic drawings illustrating various stages in a method for forming a semiconductor memory structure according to aspects of one or more embodiments of the present disclosure.
Figure 2B:
FIGS. 2B, 3B, 4B, 5B, 6B, 7B and 8B are cross-sectional views taken along line A-A' in FIGS. 2A, 3A, 4A, 5A, 6A, 7A and 8A, respectively.

FIGS. 2A, 3A, 4A, 5A, 6A, 7A and 8A are schematic drawings illustrating various stages in a method for forming a semiconductor memory structure according to aspects of one or more embodiments of the present disclosure, and FIGS. 2B, 3B, 4B, 5B, 6B, 7B and 8B are cross-sectional views taken along line A-A' in FIGS. 2A, 3A, 4A, 5A, 6A, 7A and 8A, respectively. Referring to FIGS. 2A and 2B, in some embodiments, a substrate 102 can be received or provided. In some embodiments, the substrate 102 is a silicon substrate. Alternatively or additionally, the substrate 102 includes germanium, an alloy semiconductor (for example, SiGe), another suitable semiconductor material, or combinations thereof. Alternatively, the substrate 102 is a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods. In some embodiments, the substrate 102 can include various doped regions (not shown) depending on design requirements of semiconductor memory structure. In some embodiments, the substrate 102 includes p-type doped regions (for example, p-type wells) doped with p-type dopants, such as boron (for example, BF2), indium, other p-type dopant, or combinations thereof. In some embodiments, the substrate 102 includes n-type doped regions (for example, n-type wells) doped with n-type dopants, such as phosphorus, arsenic, other n-type dopant, or combinations thereof. In some embodiments, the substrate 102 includes doped regions formed with a combination of p-type dopants and n-type dopants. The various doped regions can be formed directly on and/or in the substrate 102, for example, providing a p-well structure, an n-well structure, a dual-well structure, a raised structure, or combinations thereof. Doping may be implemented using a process such as ion implantation or diffusion in various steps and techniques.

In operation 11, a stack 110 is formed over the substrate 102. As shown in FIGS. 2A and 2B, the stack 110 includes a plurality of first layers 112 and a plurality of second layers 114. Further, the first layers 112 and the second layers 114 are alternately arranged. The number of the alternating layers included in the stack 110 can be made as high as the number of layers needed for the semiconductor memory device. Further, in some embodiments, the topmost layer and the bottom most layer can both be the first layers 112, as shown in FIG. 2B. In some embodiments, a thickness of the first layers 112 can be between approximately 250 Angstroms and approximately 1000 Angstroms, and a thickness of the second layers 114 can be between approximately 250 Angstroms and approximately 1000 Angstroms. It should be noted that the thickness of the first layers 112 and the thickness of the second layers 114 can be similar or different, depending on different product requirements. In some embodiments, the thickness of the first layer 112 and the thickness of the second layer 114 have a ratio, and the ratio is between approximately 0.1 and approximately 10. In some embodiments, the first layers 112 include a first insulating material, and the second layers 114 include a second insulating material different from the first insulating material. For example, in some embodiments, the first layers 112 include silicon oxide, and the second layers 114 include silicon nitride, but the disclosure is not limited thereto. In some alternative embodiments, the first layers 112 can include an insulating material while the second layers 114 can include a semiconductor material. For example, in some embodiments, the first layers 112 include silicon oxide, and the second layers 114 include silicon, but the disclosure is not limited thereto.

Figure 3A:
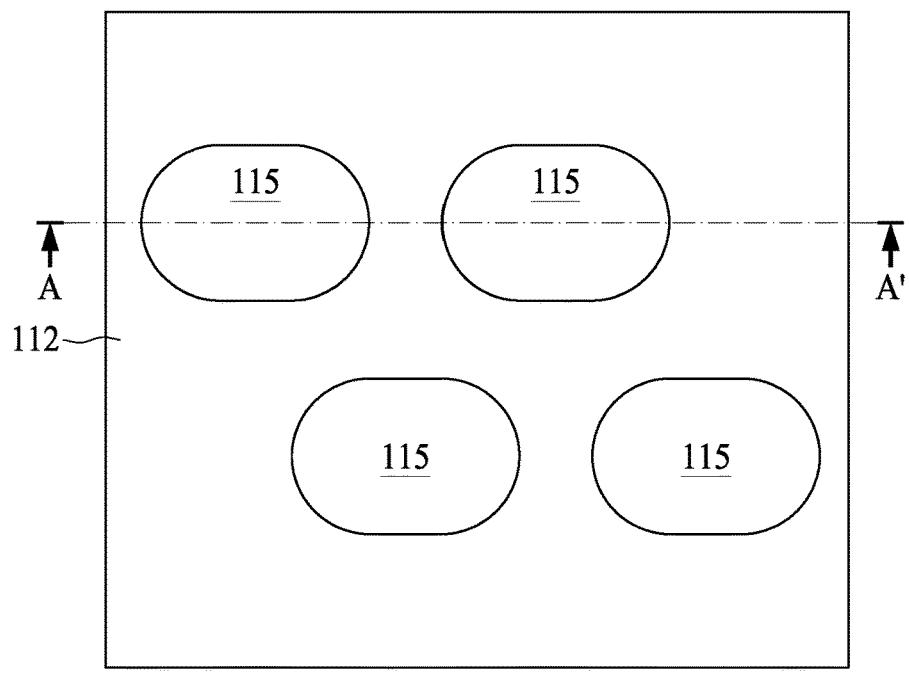
Figure 3B:
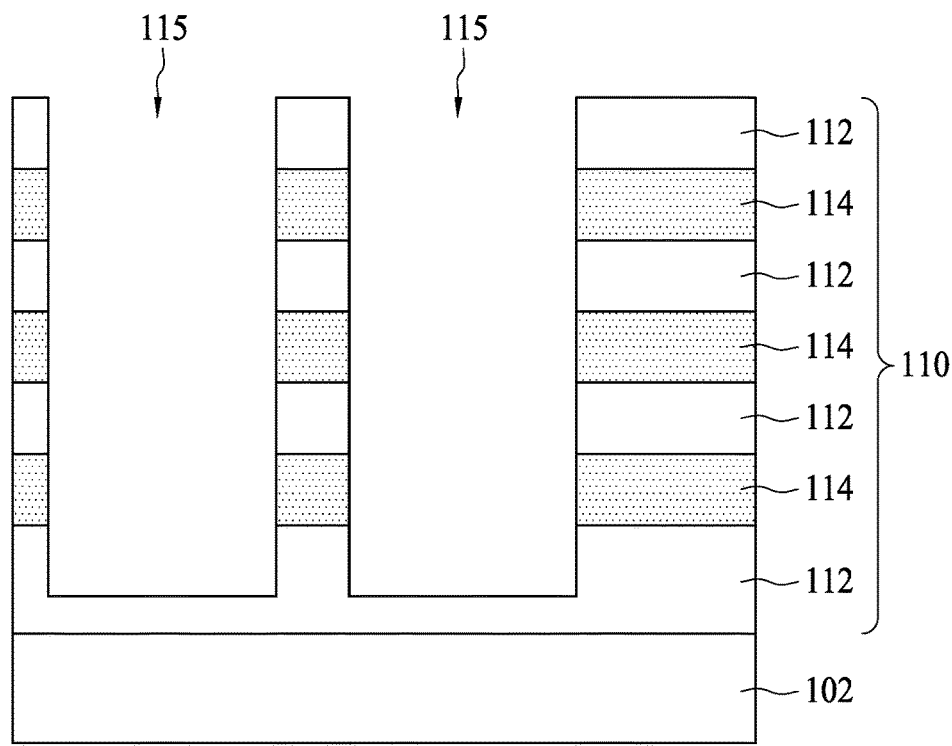

Referring to FIGS. 3A and 3B, in operation 12, at least a trench 115 is formed in the stack 110. A number of the trench 115 can be made as high as the number of they needed. A shape of the trench 115 can be made as rectangular, rhombus, oval, or circular, according to different product or design requirements. In some embodiments, a diameter of the trench 115 can be between approximately 100 nanometers and approximately 500 nanometers, but the disclosure is not limited thereto. As shown in FIG. 3A, the trenches 115 can be arranged in an array configuration of rows and columns or in a staggered array configuration. As shown in FIG. 3B, the trench 115 penetrates the stack 110. Therefore, the alternating first and second layers 112 and 114 can be observed from sidewalls of the trench 115. Further, the bottommost first layer 112 is exposed through a bottom of the trench 115.

Figure 4A:
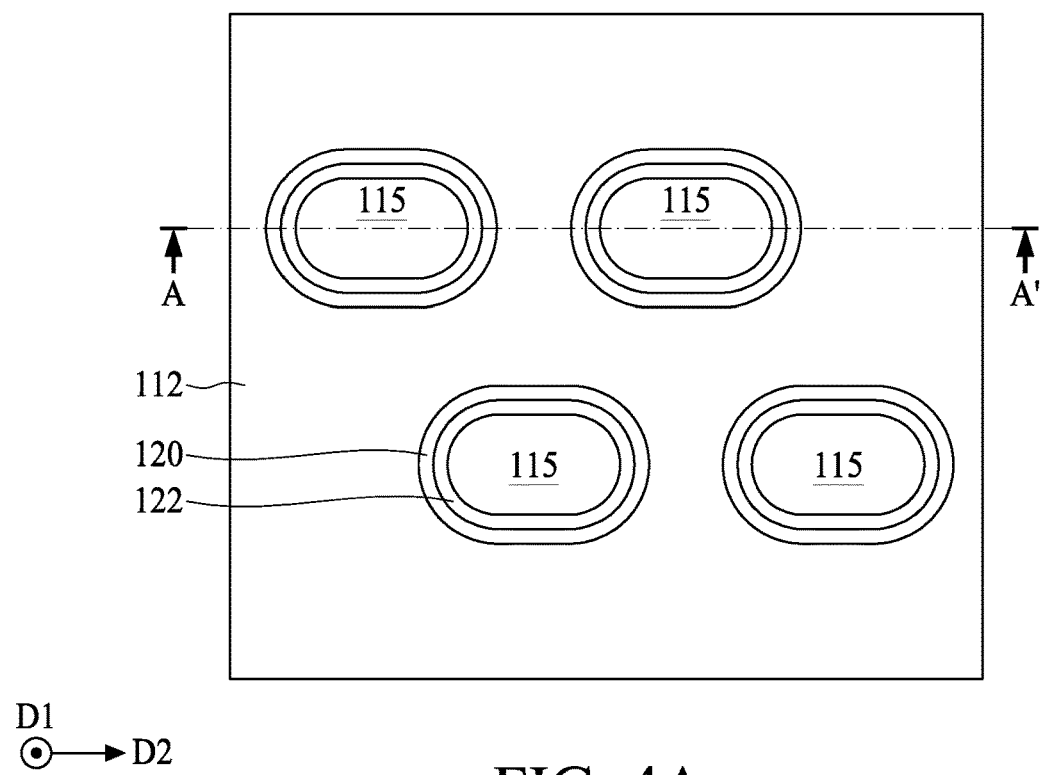
Figure 4B:
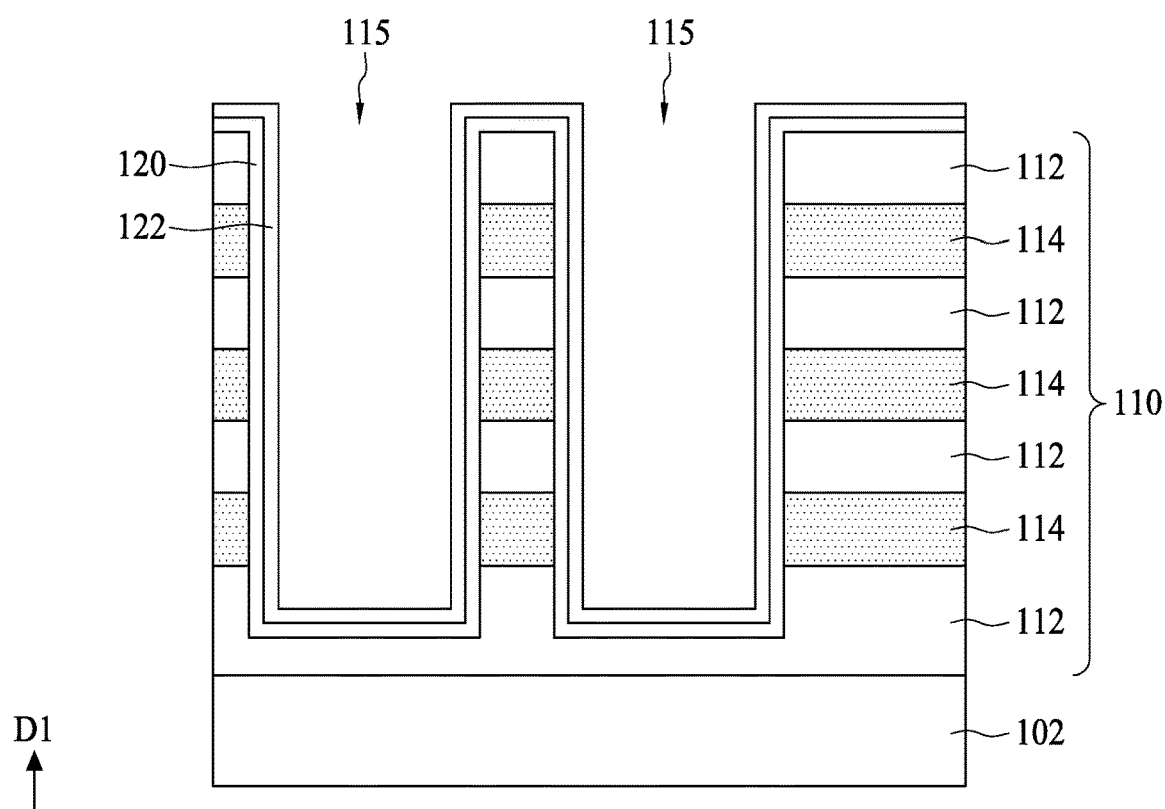

Referring to FIGS. 4A and 4B, in operation 13, a charge-trapping layer 120 and a channel layer 122 are formed in the trench 115. In some embodiments, the charge-trapping layer 120 can be referred to as a memory layer. The charge-trapping layer 120 and the channel layer 122 can be conformally formed in the trench 115 by, for example but not limited thereto, a deposition. Therefore, the charge-trapping layer 120 and the channel layer 122 cover the sidewalls and the bottom of the trench 115. In some embodiments, a thickness of the charge-trapping layer 120 is between approximately 5 nanometers and approximately 30 nanometers, but the disclosure is not limited thereto. In some embodiments, a thickness of the channel layer 122 is between approximately 5 nanometers and approximately 30 nanometers, but the disclosure is not limited thereto. The charge-trapping layer 120 can include an insulating structure or a ferroelectric material. For example, in some embodiments, the charge-trapping layer 120 can include an insulating structure such as an oxide-nitride-oxide (ONO) structure. In some alternative embodiments, the charge-trapping layer 120 can include a ferroelectric material such as hafnium silicates (HfSIO), hafnium zirconium oxide (HfZrO, also referred to as HZO), and the like. The channel layer 122 can include semiconductor materials, oxide semiconductor (OS) materials, or 2D materials. For example, the channel layer 122 can include polysilicon, amorphous silicon, and the like. In other example, the oxide semiconductor materials can include zinc oxide, cadmium oxide, indium oxide, and the like. In still another example, the 2D materials can include graphene, but the disclosure is not limited thereto.

Figure 5A:
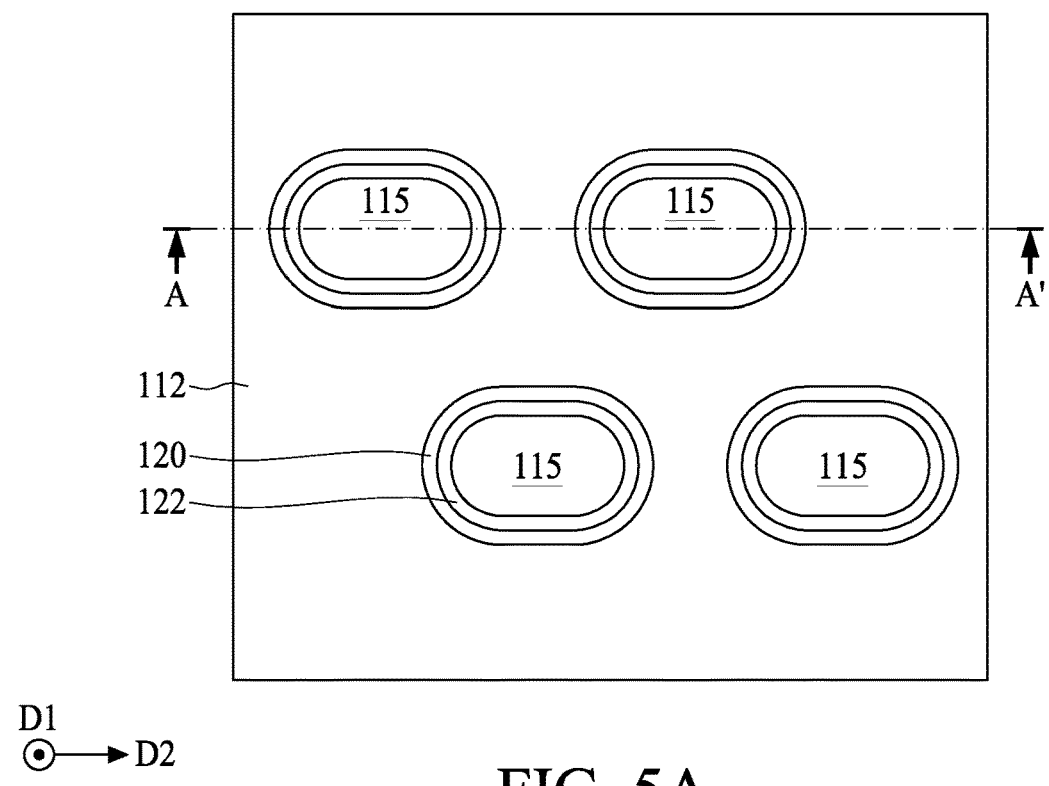
Figure 5B:
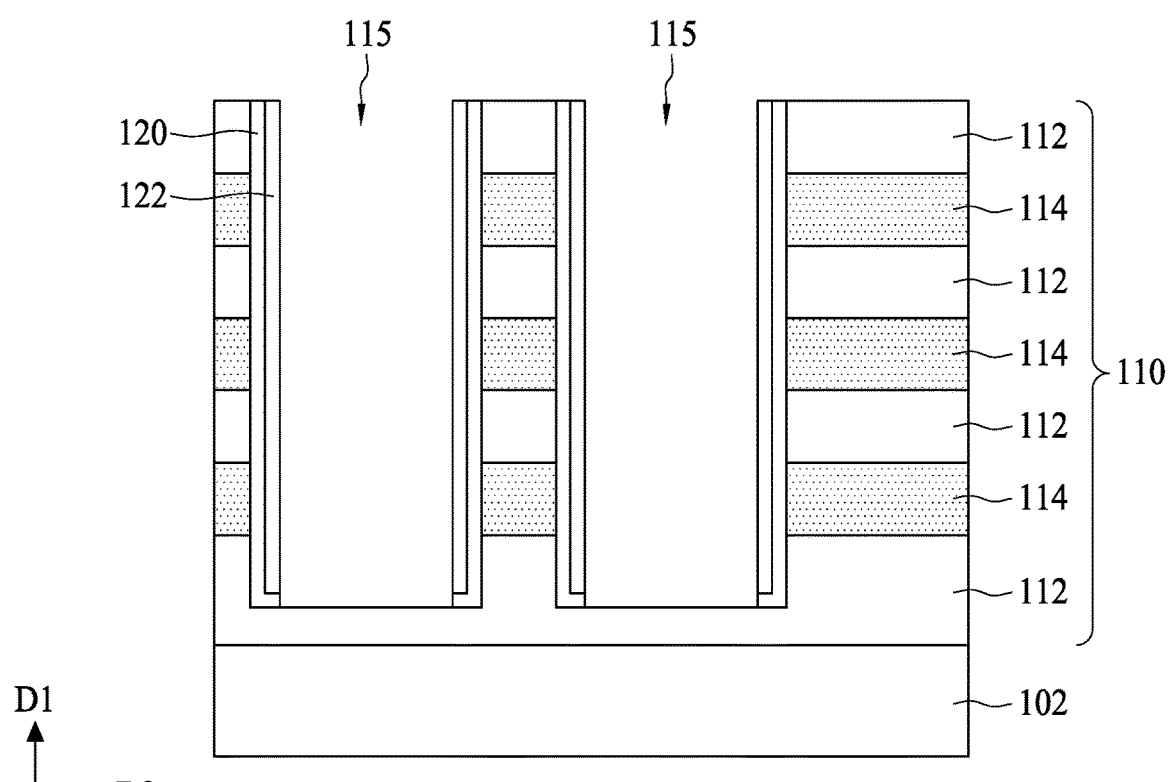

Referring to FIGS. 5A and 5B, in some embodiments, a blank etching operation can be performed to remove portions of the charge-trapping layer 120 and the channel layer 122. In some embodiments, the portions of the charge-trapping layer 120 and the channel layer 122 covering a top surface of the stack 110 and the bottom of the trench 115 are removed. Consequently, the top surface of the stack 110 and the bottom of the trench 115 are exposed. In other words, a top surface of the topmost first layer 112 and a portion of the bottommost first layer 112 are exposed.

Figure 6A:
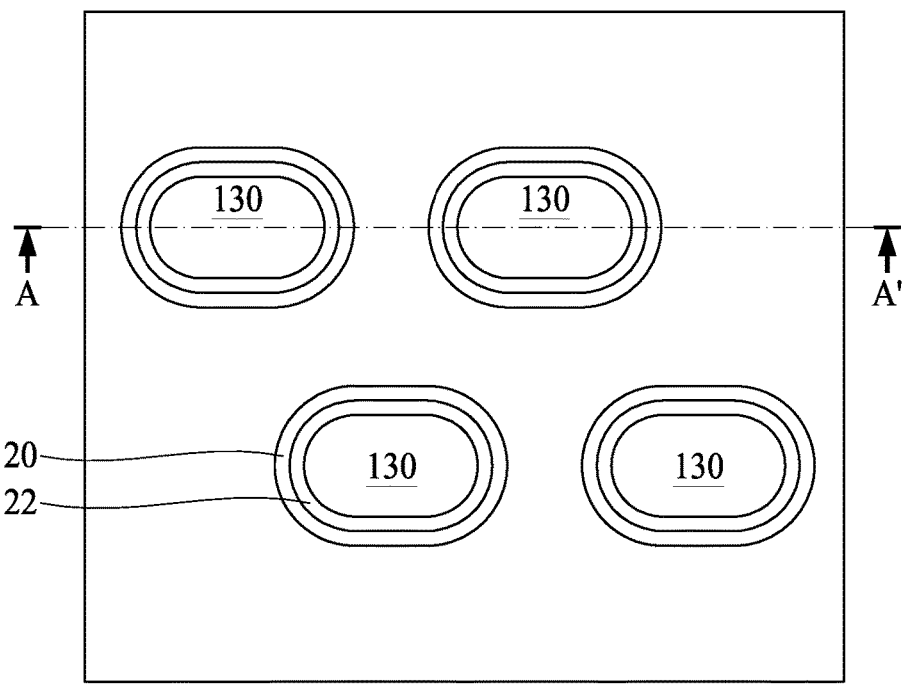
Figure 6B:
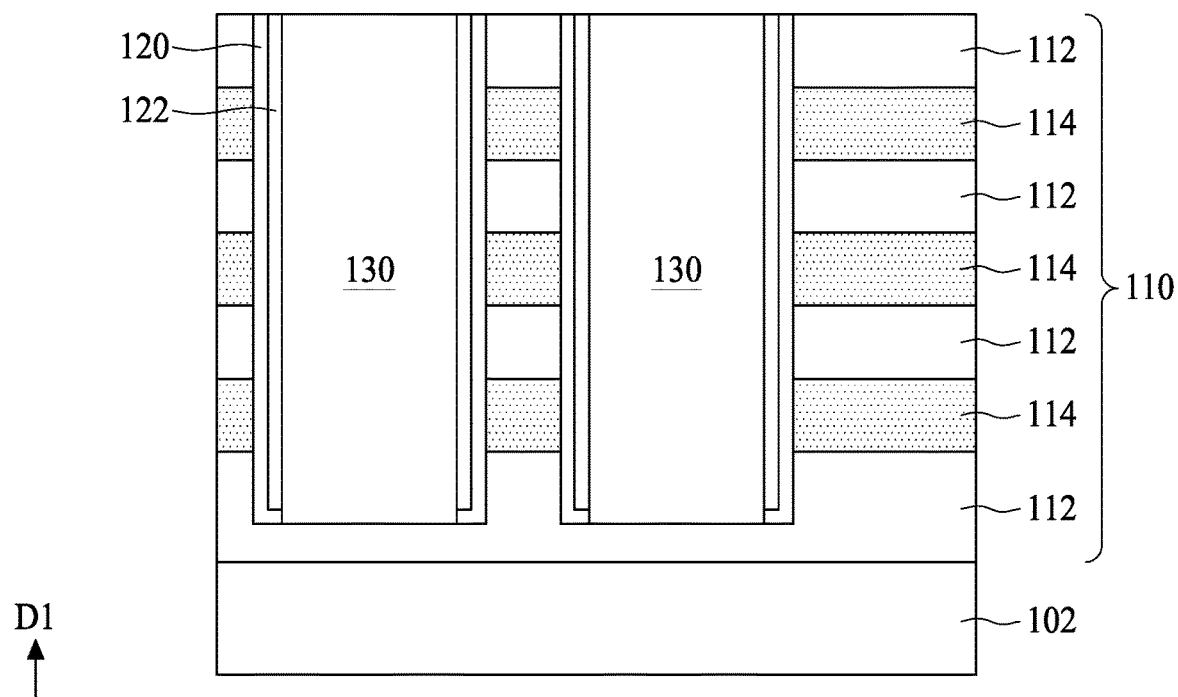

Referring to FIGS. 6A and 6B, in operation 14, an isolation structure 130 is formed in the trench 115. In some embodiments, the isolation structure 130 can include dielectric materials such as silicon oxide, silicon oxycarbide, silicon oxynitride, silicon carbonitride, and the like. In some embodiments, the trench 115 is filled with the dielectric material, and a planarization operation such as a CMP operation is performed to remove superfluous dielectric material. Accordingly, a top surface of the isolation structure 130 and the top surface of the stack 110 (i.e., the top surface of the topmost first layer 112) can be aligned with each other.

In operation 15, a source structure 140S and a drain structure 140D are formed at two sides of the isolation structure 130.

Figure 7A:
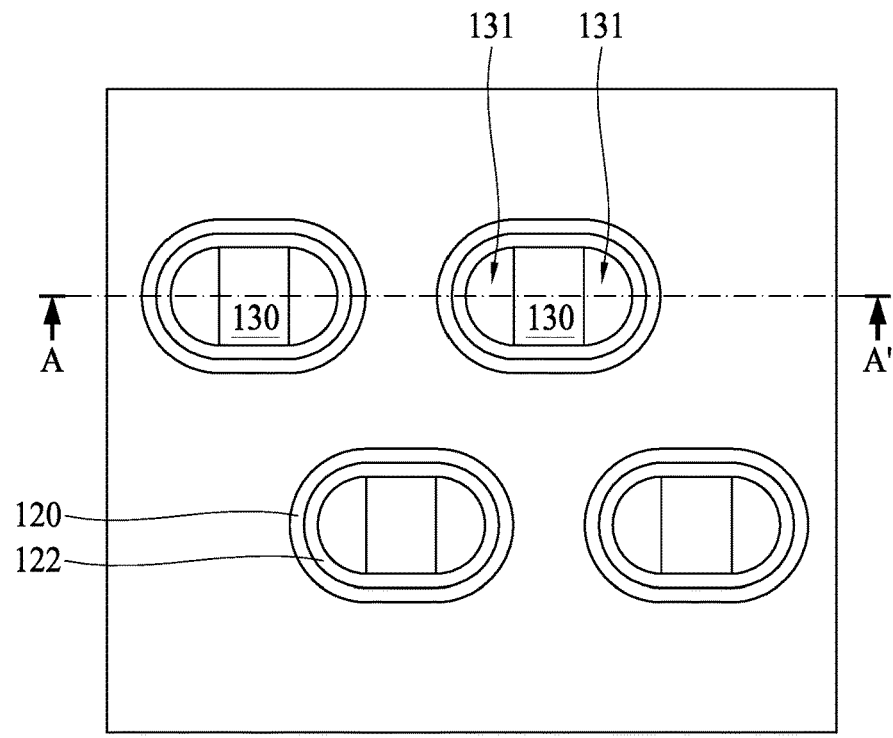
Figure 7B:
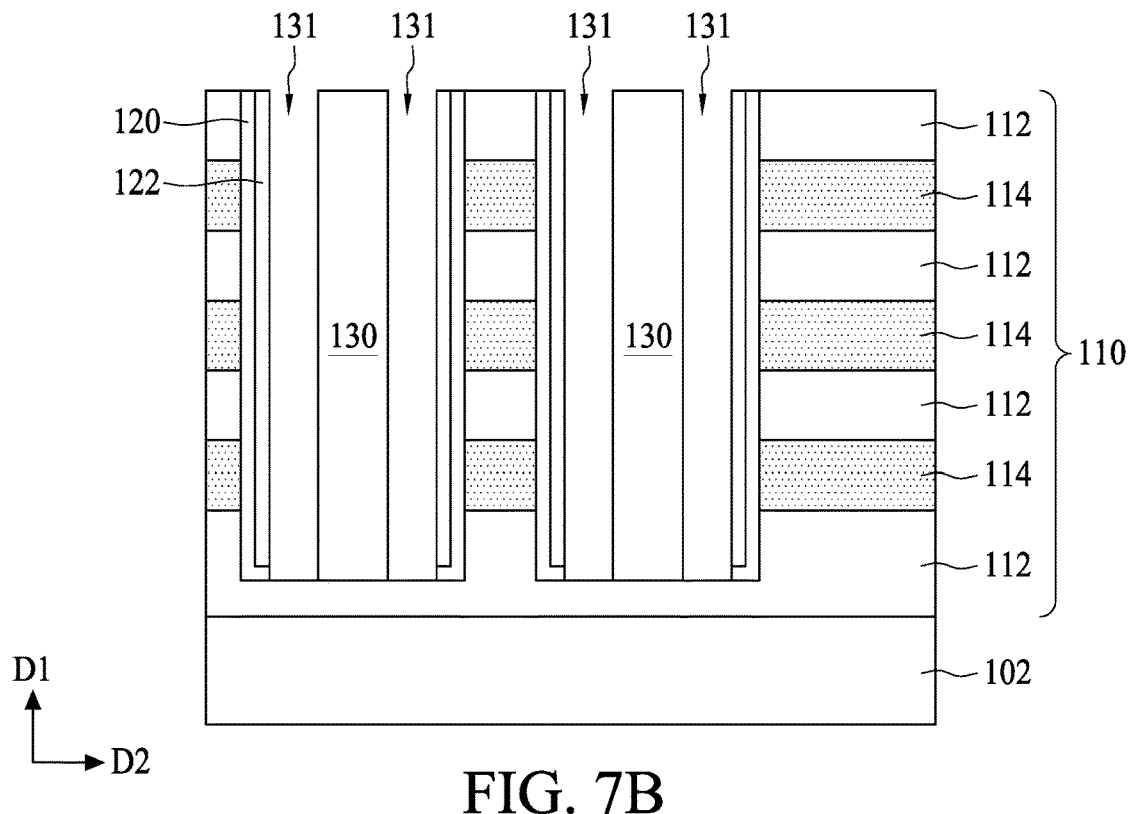
Figure 8A:
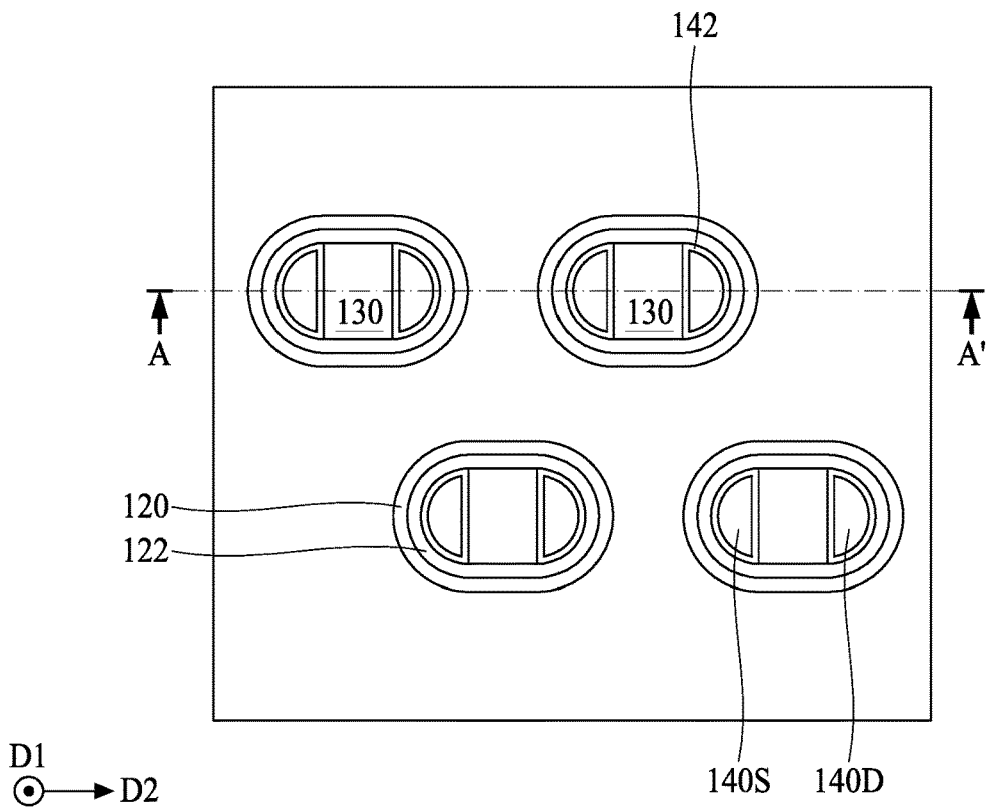
Figure 8B:
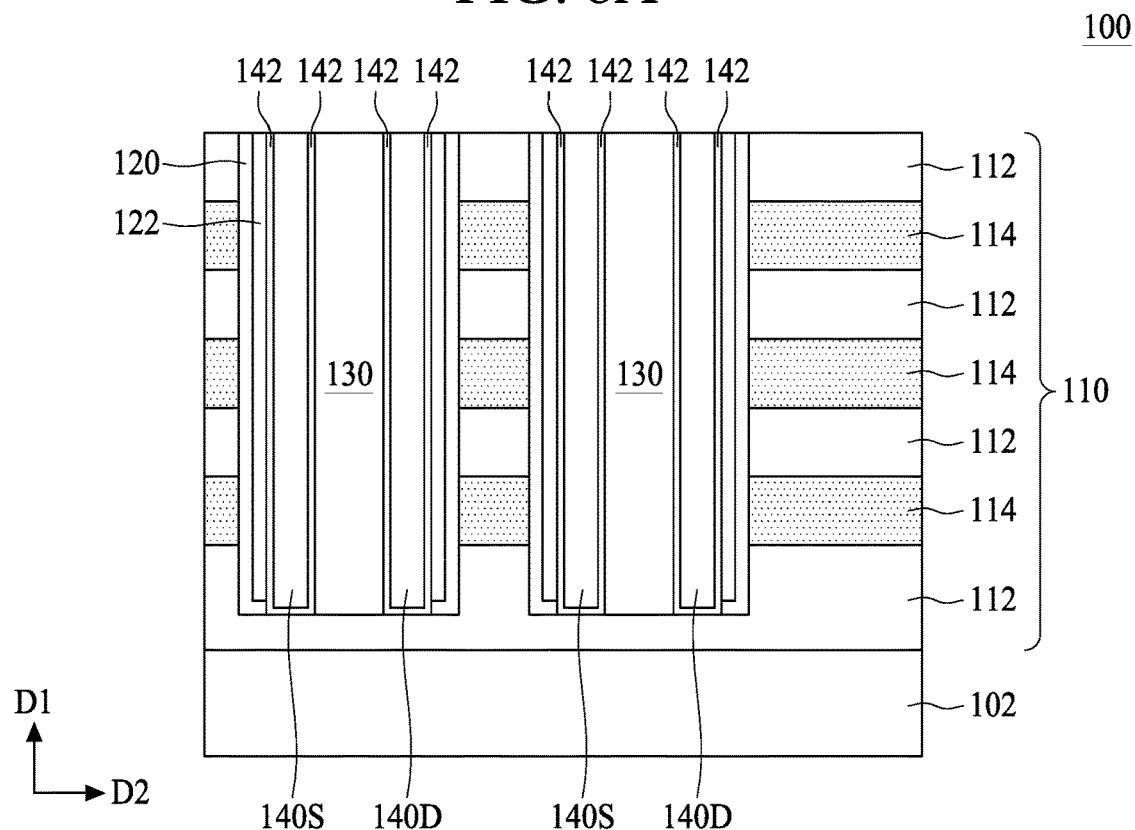

Referring to FIGS. 7A and 7B, portions of the isolation structure 130 are removed. Accordingly, a plurality of recesses 131 are formed. In some embodiments, two recesses 131 are formed at two sides of the isolation structure 130, as shown in FIGS. 7A and 7B. Further, the channel layer 122 may be exposed though sidewalls of the recesses 131. Referring to FIGS. 8A and 8B, a barrier layer 142 can be formed to cover sidewalls and a bottom of each recess 131, and then the recesses 131 are filled with a conductive material. A planarization operation such as a CMP operation is performed to remove superfluous barrier layer and conductive material. Consequently, the source structure 140S and the drain structure 140D are formed at the two sides of the isolation structure 130. In some embodiments, the barrier layer 142 includes titanium, titanium nitride, tantalum nitride, ruthenium, and the like. In some embodiments, the conductive material can include doped polysilicon, doped amorphous silicon, tungsten, copper, and the like.

In some embodiments, when the second layers 114 include the semiconductor material, the second layers 114 can serve as gate layers for the semiconductor memory structure 100, as shown in FIGS. 8A and 8B. Additionally, operations for forming conductive features such as conductive vias and conductive lines can be performed after the forming of the source structure 140S and the drain structure 140D.

According to the method for forming the semiconductor memory structure 10, a 3D semiconductor memory structure 100 can be obtained.

Figure 9:
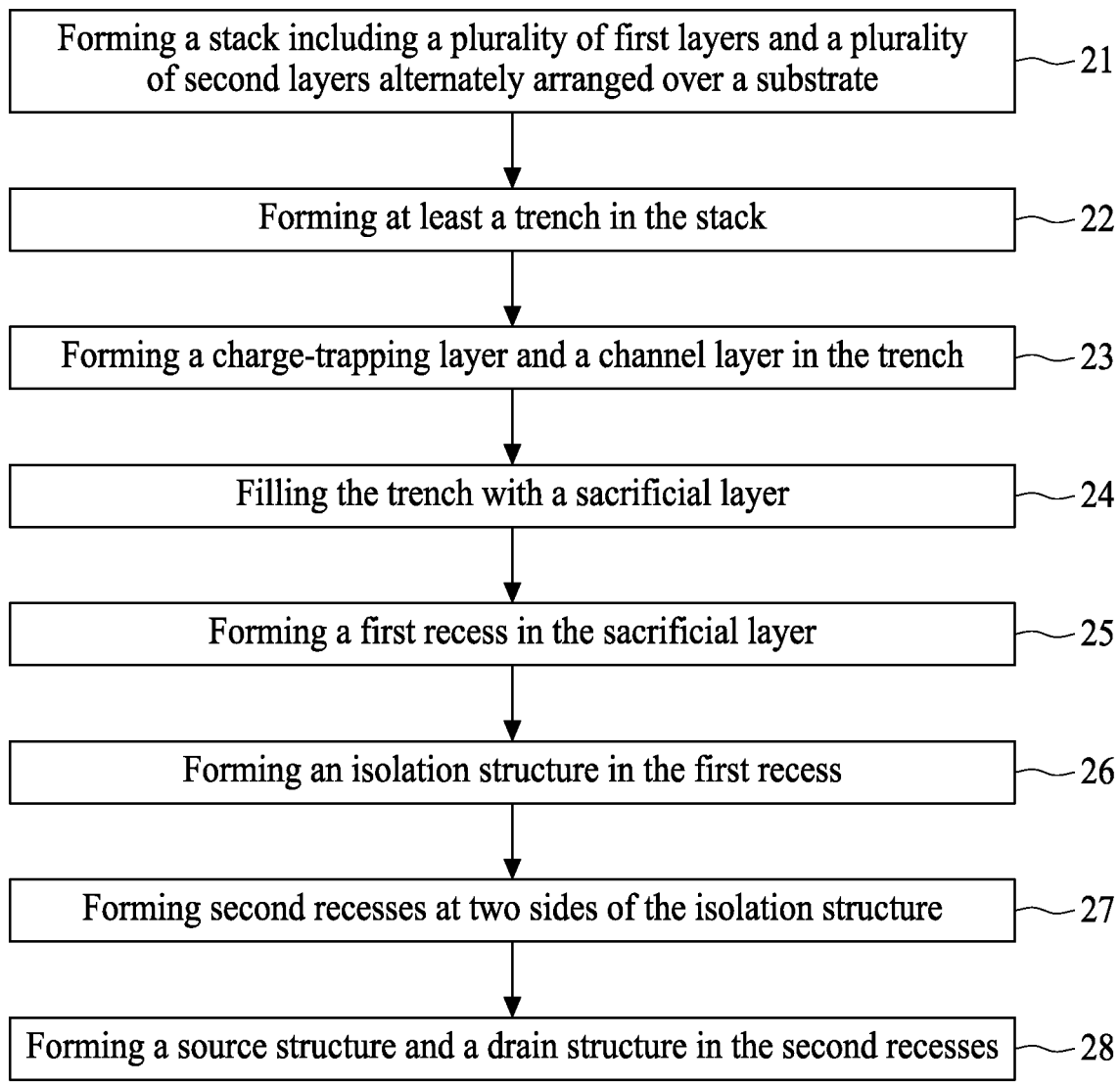
FIG. 9 is a flowchart of a method for forming a semiconductor memory structure according to various aspects of the present disclosure.

FIG. 9 is a flowchart representing a method for forming a semiconductor memory structure 20 according to aspects of the present disclosure. In some embodiments, the method for forming the semiconductor memory structure 10 includes a number of operations (21, 22, 23, 24, 25, 26, 27 and 28). The methods for forming the semiconductor memory structure 20 will be further described according to one or more embodiments. It should be noted that the operations of the methods for forming the semiconductor memory structure 20 may be rearranged or otherwise modified within the scope of the various aspects. It should further be noted that additional processes may be provided before, during, and after the method 20, and that some other processes may be only briefly described herein.

FIGS. 2A, 3A, 4A, 5A, 10A, 11A, 12A, 13A and 14A are schematic drawings illustrating various stages in a method for forming a semiconductor memory structure according to aspects of one or more embodiments of the present disclosure, and FIGS. 2B, 3B, 4B, 5B, 10B, 11B, 12B, 13B and 14B are cross-sectional views taken along line A-A' in FIGS. 2A, 3A, 4A, 5A, 10A, 11A, 12A, 13A and 14A, respectively. Further, operations shown in FIGS. 10A to 14A and FIGS. 10B to 14B may be performed after performing operations associated with FIGS. 2A to 5A and 2B and 5B. It should be noted that same elements are indicated by the same numerals, and repeated descriptions of those elements can be omitted for brevity.

Referring to FIGS. 2A and 2B, in some embodiments, a substrate 102 can be received or provided. In some embodiments, the substrate 102 can include various doped regions (not shown) depending on design requirements of semiconductor memory structure. In operation 21, a stack 110 is formed over the substrate 102. As shown in FIGS. 2A and 2B, the stack 110 includes a plurality of first layers 112 and a plurality of second layers 114. Further, the first layers 112 and the second layers 114 are alternately arranged. The number of the alternating layers included in the stack 110 can be made as high as the number of layers needed for the semiconductor memory device. Further, in some embodiments, the topmost layer and the bottom most layer can be the first layers 112, as shown in FIG. 2B. A thickness and materials used to form the first layers 112 can be similar as mentioned above, and a thickness and material used to form the second layers 114 can be similar as mentioned above, therefore those details are omitted for brevity.

Referring to FIGS. 3A and 3B, in operation 22, at least a trench 115 is formed in the stack 110. A number of the trench 115 can be made as high as the number of they needed. A shape and a diameter of the trench 115 can be can be similar as mentioned above; therefore, those details are omitted for brevity. As shown in FIG. 3A, the trenches 115 can be arranged in an array configuration of rows and columns or in a staggered array configuration. As shown in FIG. 3B, the trench 115 penetrates the stack 110. Therefore, the alternating first and second layers 112 and 114 can be observed from sidewalls of the trench 115. Further, the bottom most first layer 112 is exposed though a bottom of the trench 115, as shown in FIG. 3B. Referring to FIGS. 4A and 4B, in operation 23, a charge-trapping layer 120 and a channel layer 122 are formed in the trench 115. As mentioned above, the charge-trapping layer 120 can be referred to as a memory layer. Materials and methods for forming the charge-trapping layer 120 and the channel layer 122 can be similar as mentioned above, therefore those details are omitted for brevity. Referring to FIGS. 5A and 5B, a blank etching operation can be performed to remove portions of the charge-trapping layer 120 and the channel layer 122. In some embodiments, the portions of the charge-trapping layer 120 and the channel layer 122 covering a top surface of the stack 110 and the bottom of the trench 115 are removed. Consequently, the top surface of the stack 110 and the bottom of the trench 115 are exposed. In other words, a top surface of the topmost first layer 112 and a portion of the bottom most first layer 112 are exposed.

Figure 10A:
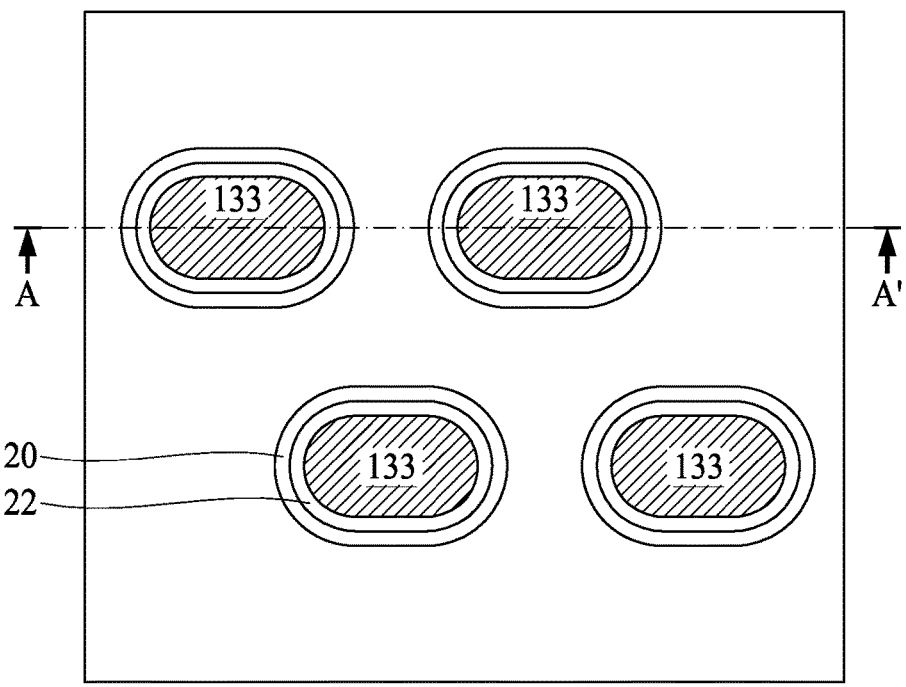
FIGS. 10A, 11A, 12A, 13A, and 14A are schematic drawings illustrating various stages in a method for forming a semiconductor memory structure after performing the operation associated with FIG. 5A according to aspects of one or more embodiments of the present disclosure.
Figure 10B:
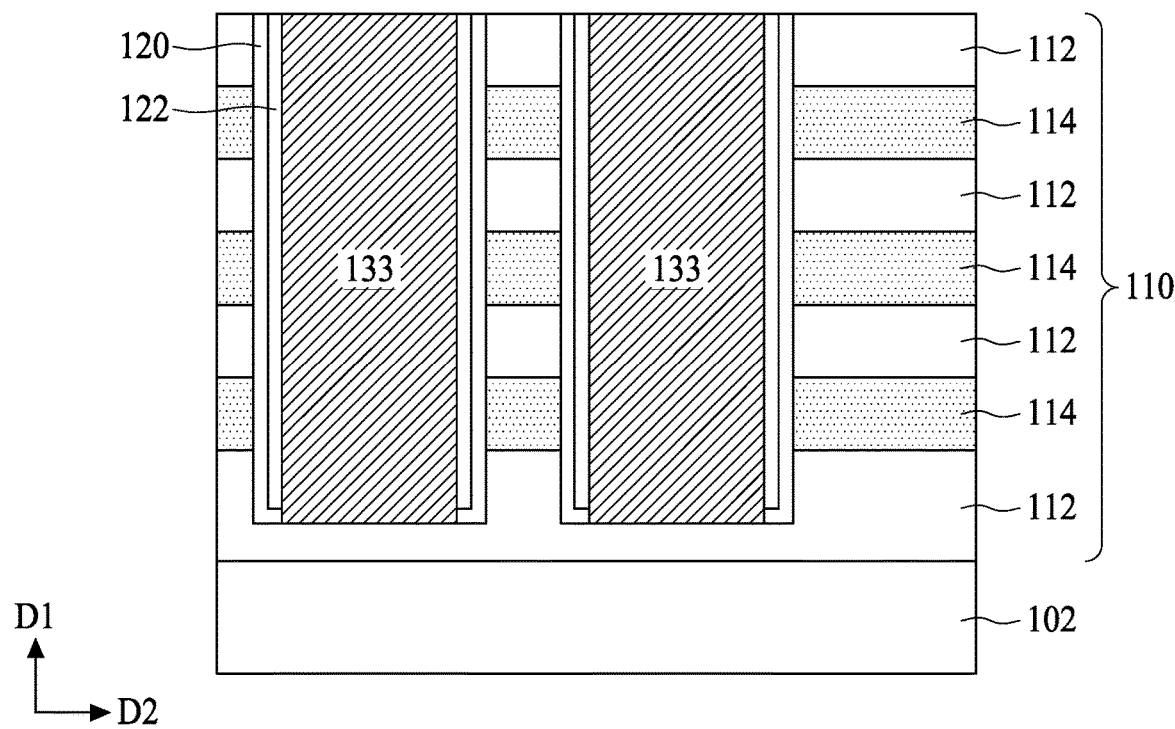
FIGS. 10B, 11B, 12B, 13B and 14B are cross-sectional views taken along line A-A' in FIGS. 10A, 11A, 12A, 13A and 14A, respectively.

Referring to FIGS. 10A and 10B, in operation 24, the trench 115 is filled with a sacrificial layer 133. In some embodiments, the sacrificial layer 133 can include SiN, Si, Polymer, Spin-on-Carbon, etc . . . . In some embodiments, the sacrificial layer 133 may cover the top surface of the stack 110. A planarization operation such as a CMP operation can be performed to remove superfluous sacrificial layer 133. Accordingly, a top surface of the sacrificial layer 133 and the top surface of the stack 110 (i.e., the top surface of the topmost first layer 112) can be aligned with each other.

Figure 11A:
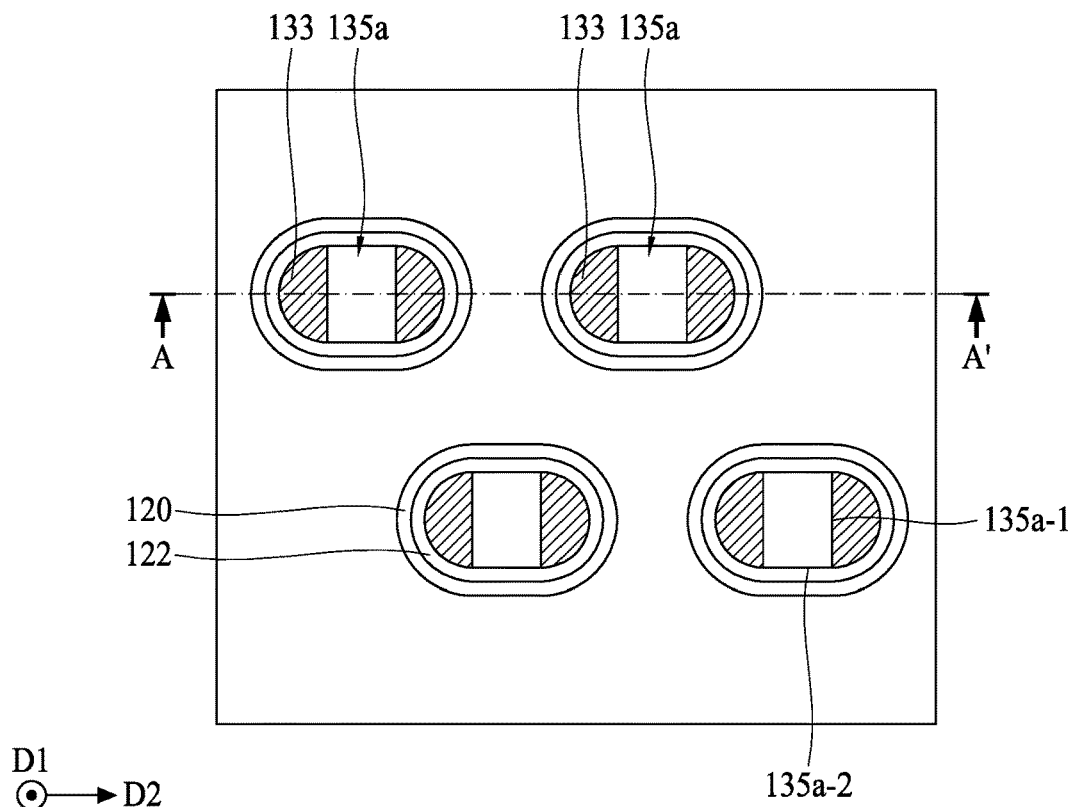
Figure 11B:
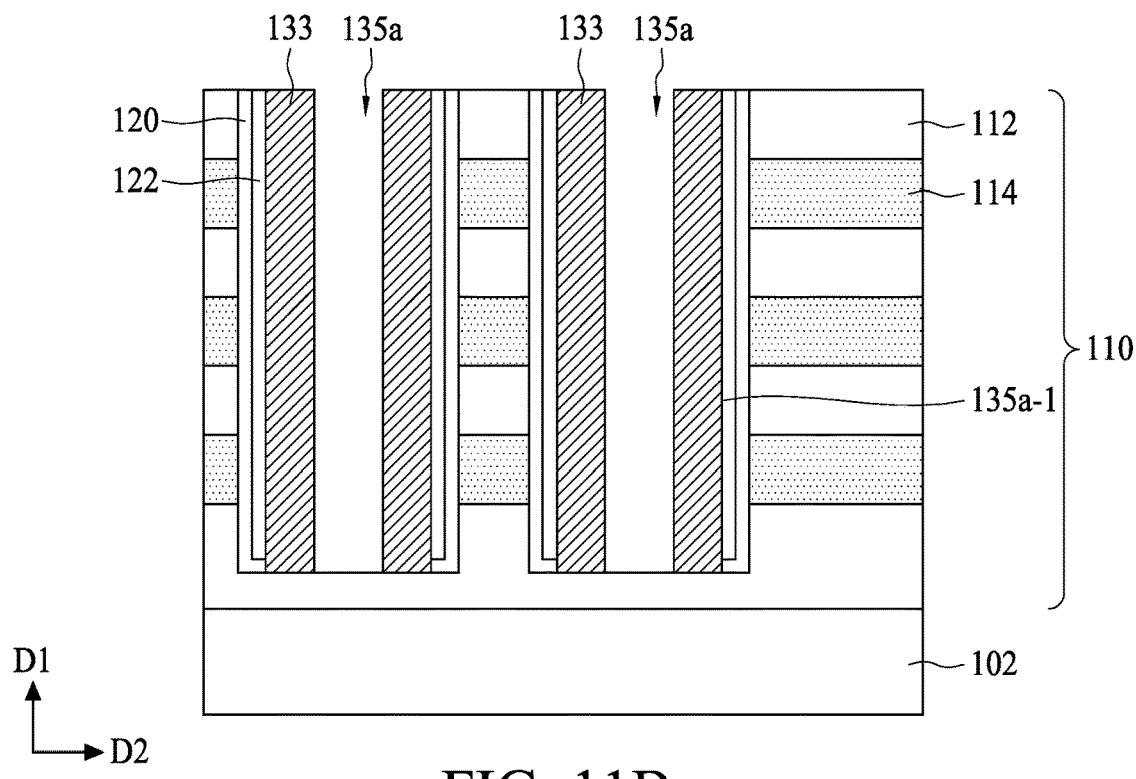

Referring to FIGS. 11A and 11B, in operation 25, a recess 135a can be formed in the sacrificial layer 133 by removing a portion of the sacrificial layer 133. In some embodiments, the recess 135a may include a pair of first sidewalls 135a-1 and a pair of second sidewalls 135a-2. In some embodiments, the sacrificial layer 133 may be exposed through the pair of first sidewalls 135a-1 while the channel layer 122 may be exposed through the pair of second sidewalls 135a-2, as shown in FIG. 11A. In some embodiments, the first layer 112 of the stack 110, such as the bottommost first layer 112 of the stack 110 may be exposed through a bottom of the recess 135a, as shown in FIG. 11B.

Figure 12A:
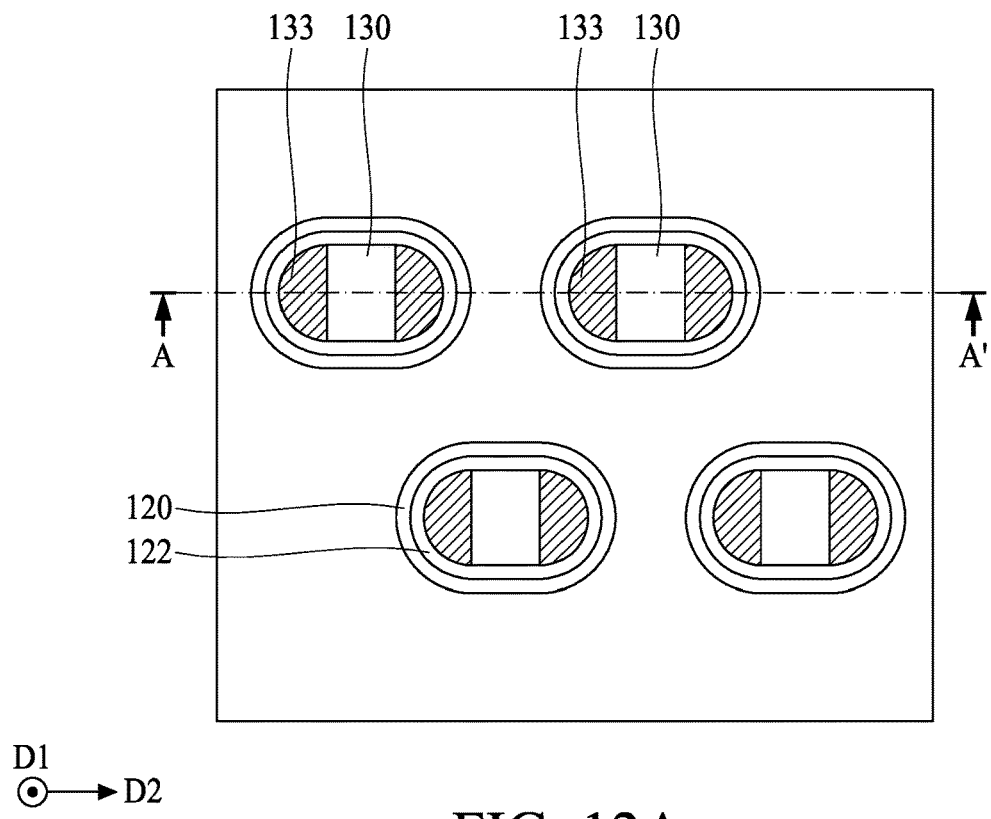
Figure 12B:
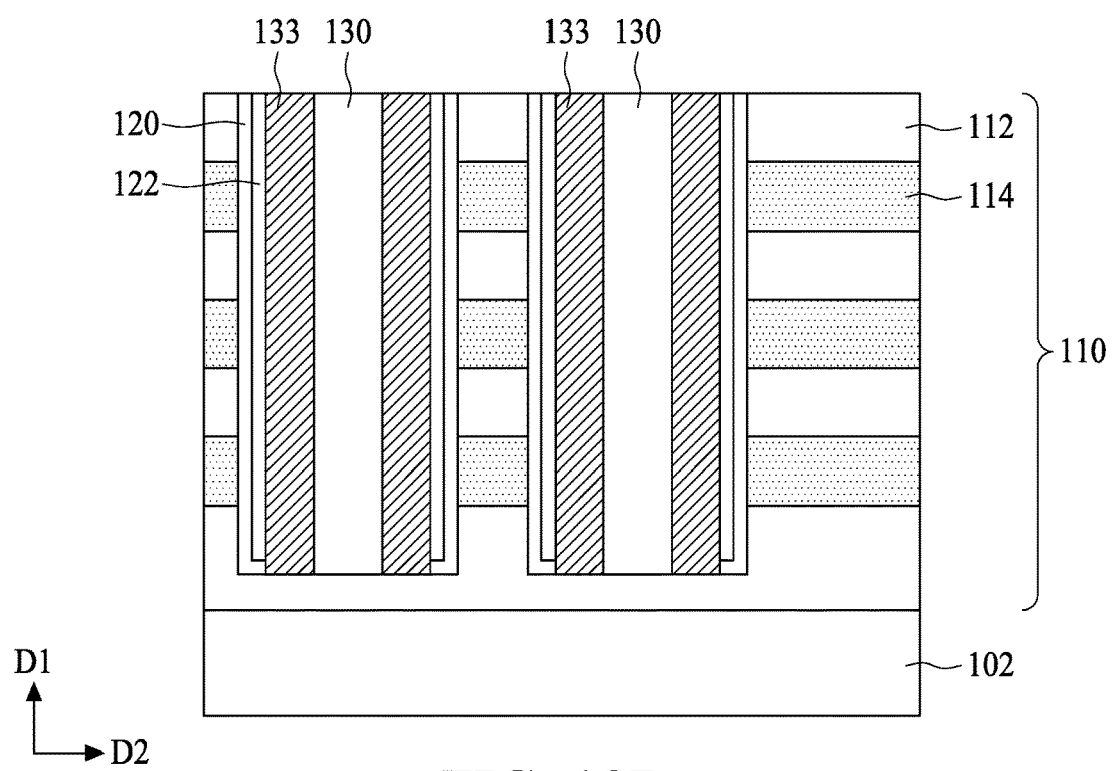

Referring to FIGS. 12A and 12B, in operation 26, an isolation structure 130 is formed in the recess 135a. In some embodiments, the recess 135a is filled with a dielectric material, and a planarization operation such as CMP operation is performed to remove superfluous dielectric material and to form the isolation structure 130. Accordingly, a top surface of the isolation structure 130 and the top surface of the stack 110 (i.e., the top surface of the topmost first layer 112) can be aligned with each other. Additionally, materials for forming the isolation structure 130 can be similar as mentioned above; therefore, those details are omitted for brevity.

Figure 13A:
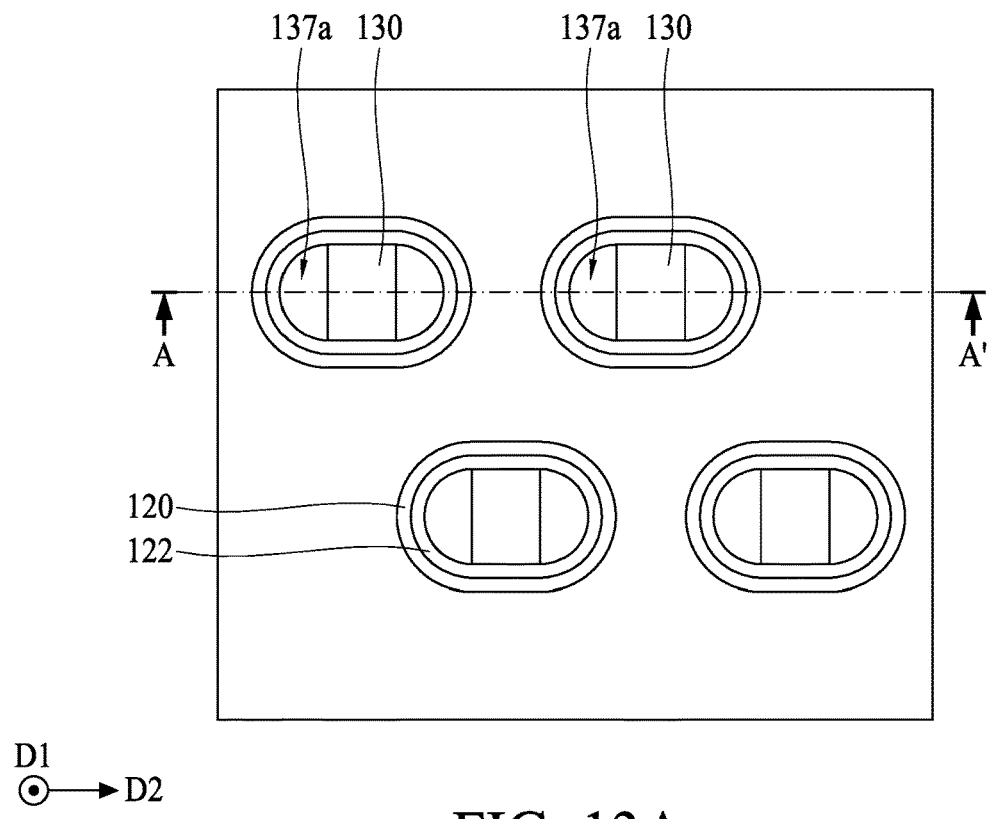
Figure 13B:
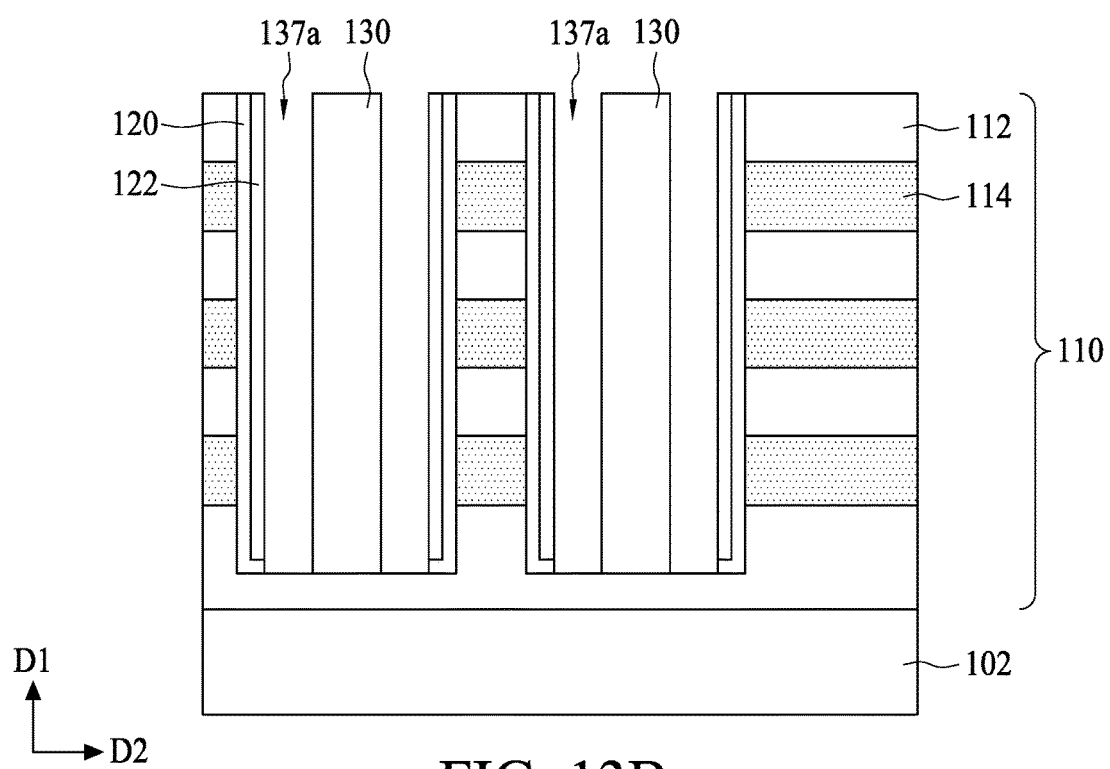

Referring to FIGS. 13A and 13B, in operation 27, recesses 137a are formed at two sides of the isolation structure 130. In some embodiments, the remaining sacrificial layer 133 are removed, thus recesses 137a are formed at the two sides of the isolation structure 130. Further, the channel layer 122 and the isolation structure 130 may be exposed though sidewalls of each recess 137a, while the first layer 112 of the stack 110 (i.e., the bottom most first layer 112 of the stack 110) may be exposed through a bottom of each recess 137a. In some embodiments, the recesses 137a include a similar size.

Figure 14A:
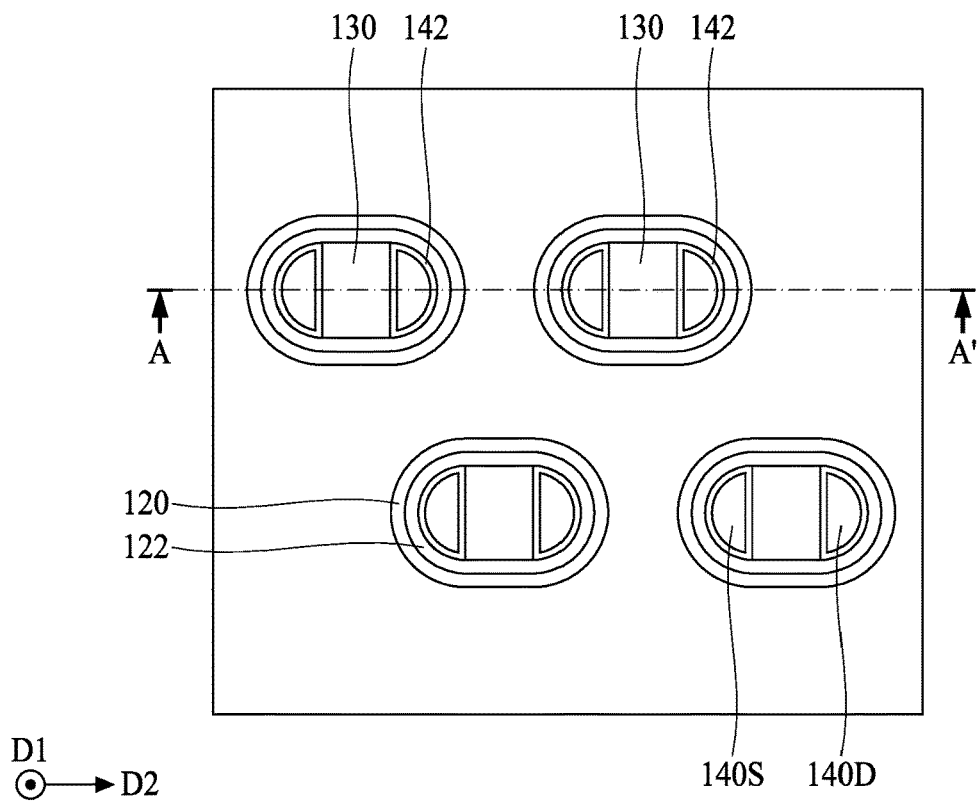
Figure 14B:
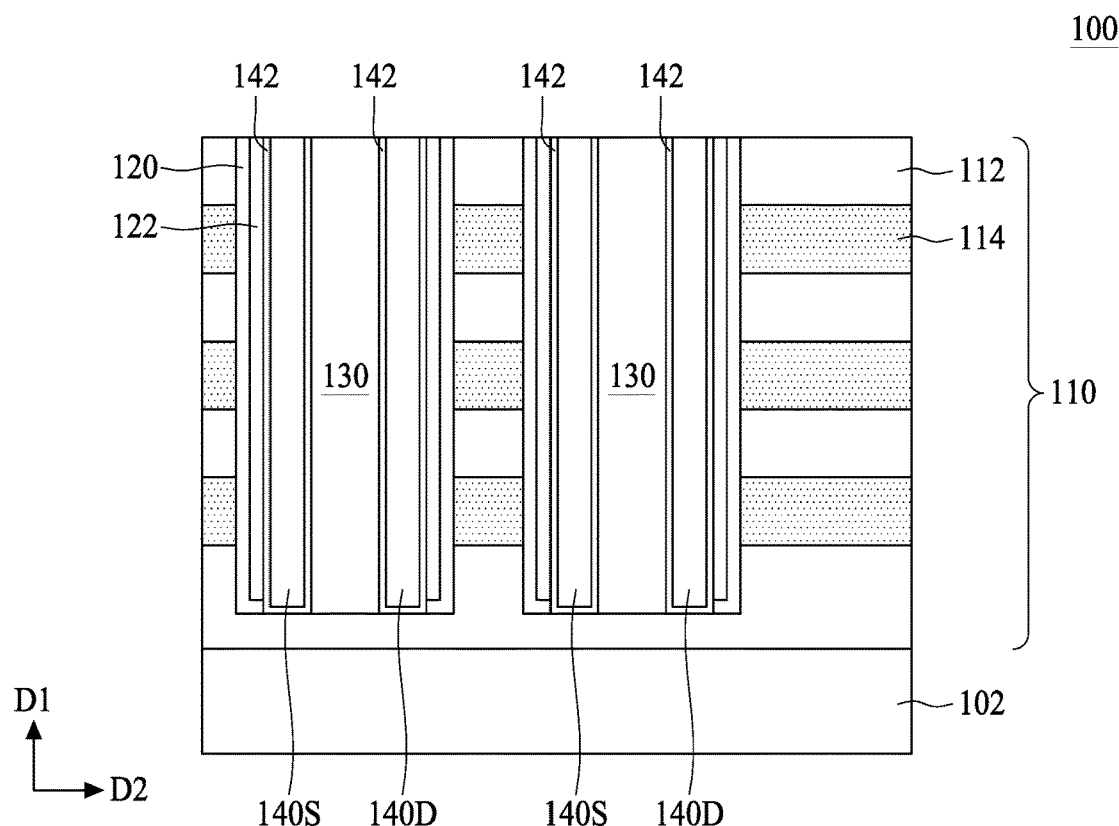

In operation 28, a source structure 140S and a drain structure 140D are respectively formed in the recesses 137a at the two sides of the isolation structure 130. Referring to FIGS. 14A and 14B, in some embodiments, a barrier layer 142 can be formed to cover sidewalls and a bottom of each recess 137a, and then the recesses 137a are filled with a conductive material. A planarization operation such as a CMP operation is performed to remove superfluous barrier layer and conductive material. Consequently, the source structure 140S and the drain structure 140D are formed at the two sides of the isolation structure 130. Materials for forming the barrier layer 142, the source structure 140S and the drain structure 140D can be similar as mentioned above; therefore, those details are omitted for brevity.

In some embodiments, when the second layers 114 include the semiconductor material, the second layers 114 can serve as gate layers for the semiconductor memory structure 100, as shown in FIGS. 14A and 14B. Additionally, operations for forming conductive features such as conductive vias and conductive lines can be performed after the forming of the source structure 140S and the drain structure 140D.

According to the method for forming the semiconductor memory structure 20, a 3D semiconductor memory structure 100 can be obtained.

Figure 15:
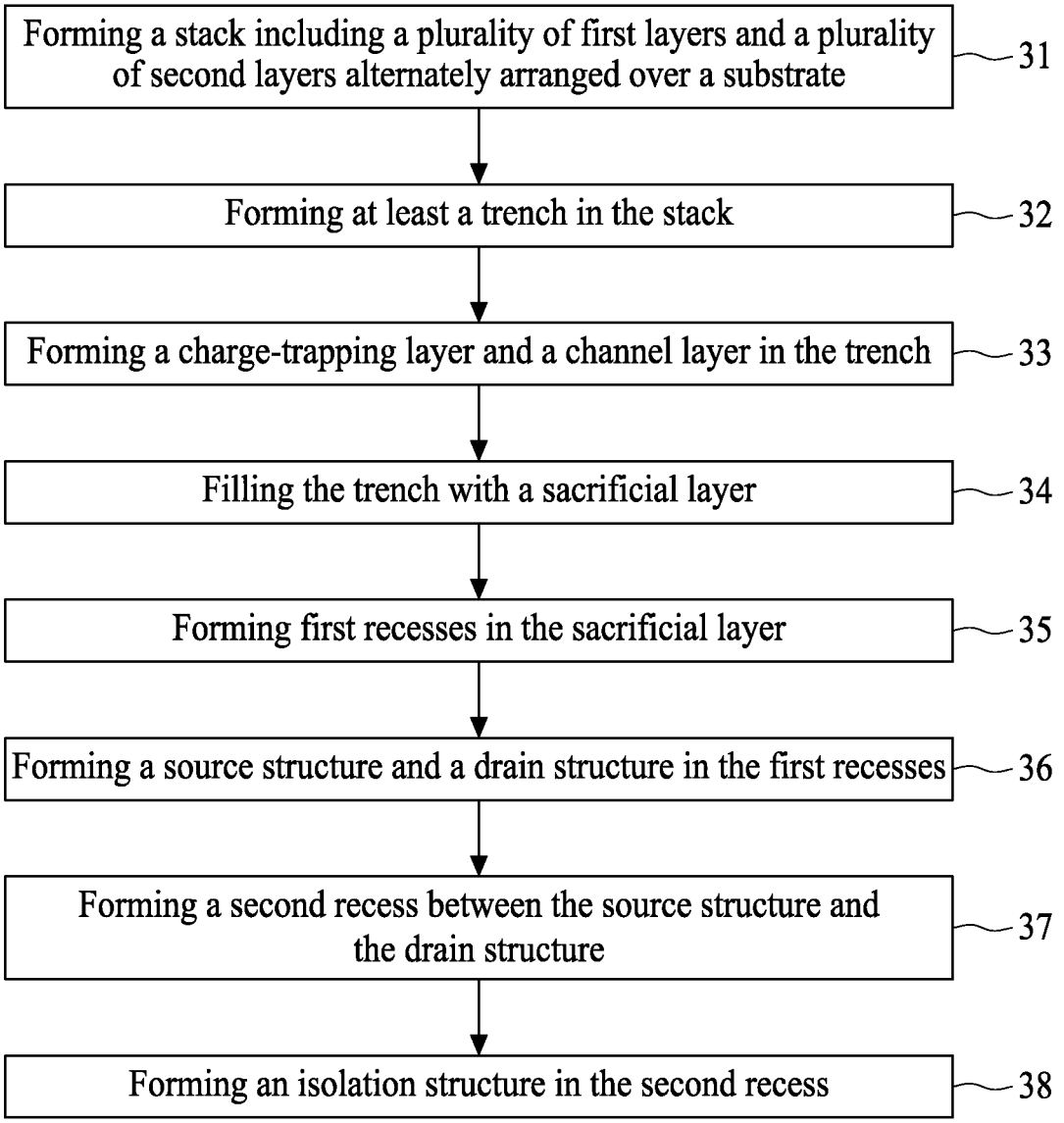
FIG. 15 is a flowchart of a method for forming a semiconductor memory structure according to various aspects of the present disclosure.

FIG. 15 is a flowchart representing a method for forming a semiconductor memory structure 30 according to aspects of the present disclosure. In some embodiments, the method for forming the semiconductor memory structure 30 includes a number of operations (31, 32, 33, 34, 35, 36, 37 and 38). The methods for forming the semiconductor memory structure 30 will be further described according to one or more embodiments. It should be noted that the operations of the methods for forming the semiconductor memory structure 30 may be rearranged or otherwise modified within the scope of the various aspects. It should further be noted that additional processes may be provided before, during, and after the method 30, and that some other processes may be only briefly described herein.

FIGS. 2A, 3A, 4A, 5A, 10A, 16A, 17A, 18A and 19A are schematic drawings illustrating various stages in a method for forming a semiconductor memory structure according to aspects of one or more embodiments of the present disclosure, and FIGS. 2B, 3B, 4B, 5B, 10A, 16B, 17B, 18B and 19B are cross-sectional views taken along line A-A' in FIGS. 2A, 3A, 4A, 5A, 10A, 16A, 17A, 18A and 19A, respectively. Further, operations shown in FIGS. 16A to 19A and FIGS. 16B to 19B may be performed after performing operations associated with FIGS. 10A and 10B, and same elements are indicated by the same numerals, and repeated descriptions of those elements can be omitted for brevity.

Referring to FIGS. 2A and 2B, in some embodiments, a substrate 102 can be received or provided. In operation 31, a stack 110 is formed over the substrate 102. As mentioned above, the stack 110 includes a plurality of first layers 112 and a plurality of second layers 114. Further, the first layers 112 and the second layers 114 are alternately arranged. The number of the alternating layers included in the stack 110 can be made as high as the number of layers needed for the semiconductor memory device. Further, in some embodiments, the topmost layer and the bottom most layer can be the first layers 112, as shown in FIG. 2B. Referring to FIGS. 3A and 3B, in operation 32, at least a trench 115 is formed in the stack 110. Referring to FIGS. 4A and 4B, in operation 33, a charge-trapping layer 120 and a channel layer 122 are formed in the trench 115. Referring to FIGS. 5A and 5B, a blank etching operation can be performed to remove portions of the charge-trapping layer 120 and the channel layer 122. In some embodiments, the portions of the charge-trapping layer 120 and the channel layer 122 covering a top surface of the stack 110 and the bottom of the trench 115 are removed. Consequently, the top surface of the stack 110 and the bottom of the trench 115 are exposed. In other words, a top surface of the topmost first layer 112 and a portion of the bottom most first layer 112 are exposed.

Referring to FIGS. 10A and 10B, in operation 34, the trench 115 is filled with a sacrificial layer 133. Materials for forming the sacrificial layer 133 can be similar as mentioned above; therefore, those details are omitted for brevity.

Figure 16A:
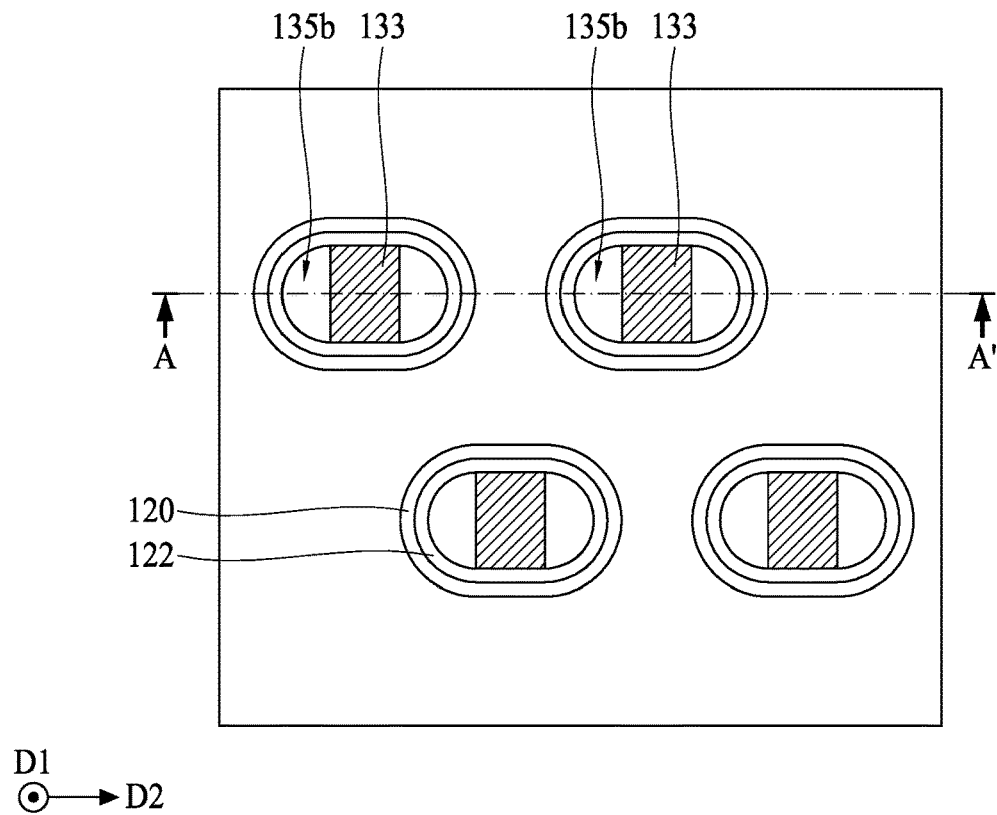
FIGS. 16A, 17A, 18A and 19A are schematic drawings illustrating various stages in a method for forming a semiconductor memory structure after performing the operation associated with FIG. 10A according to aspects of one or more embodiments of the present disclosure.
Figure 16B:
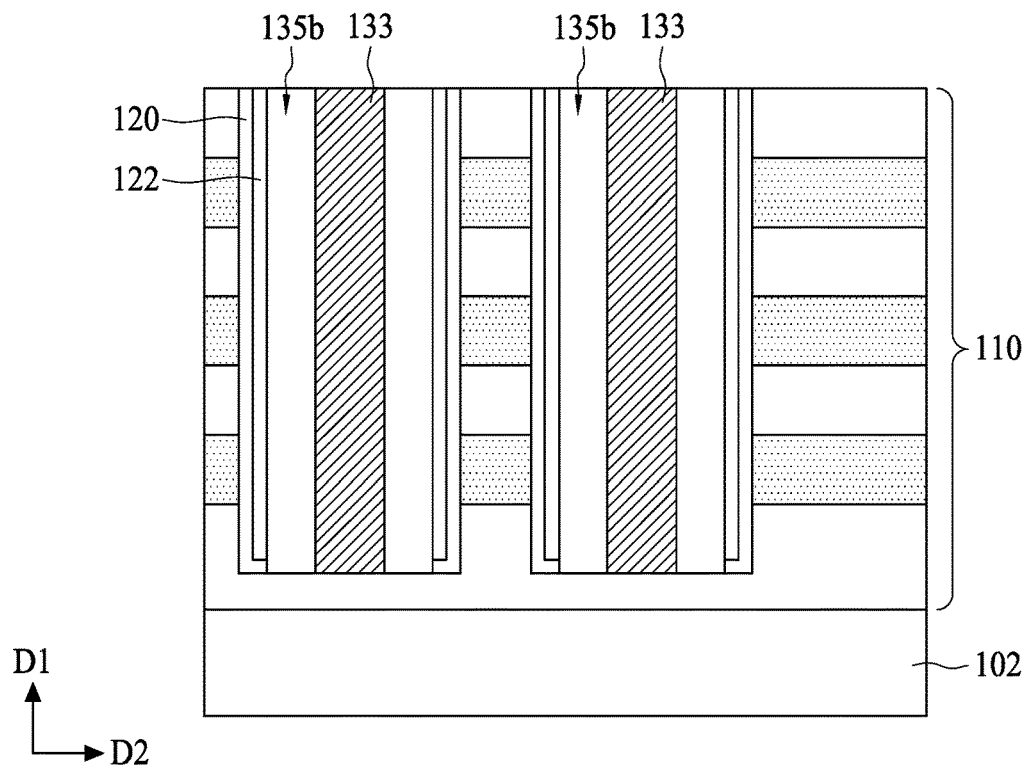
FIGS. 16B, 17B, 18B and 19B are cross-sectional views taken along line A-A' in FIGS. 16A, 17A, 18A and 19B, respectively.

Referring to FIGS. 16A and 16B, in operation 35, portions of the sacrificial layer 133 is removed. Accordingly, recesses 135b can be formed in the sacrificial layer 133. In some embodiments, the recesses 135b are formed at two sides of the sacrificial layer 133. Further, the channel layer 122 and the sacrificial layer 133 may be exposed through sidewalls of each recess 135b.

Figure 17A:
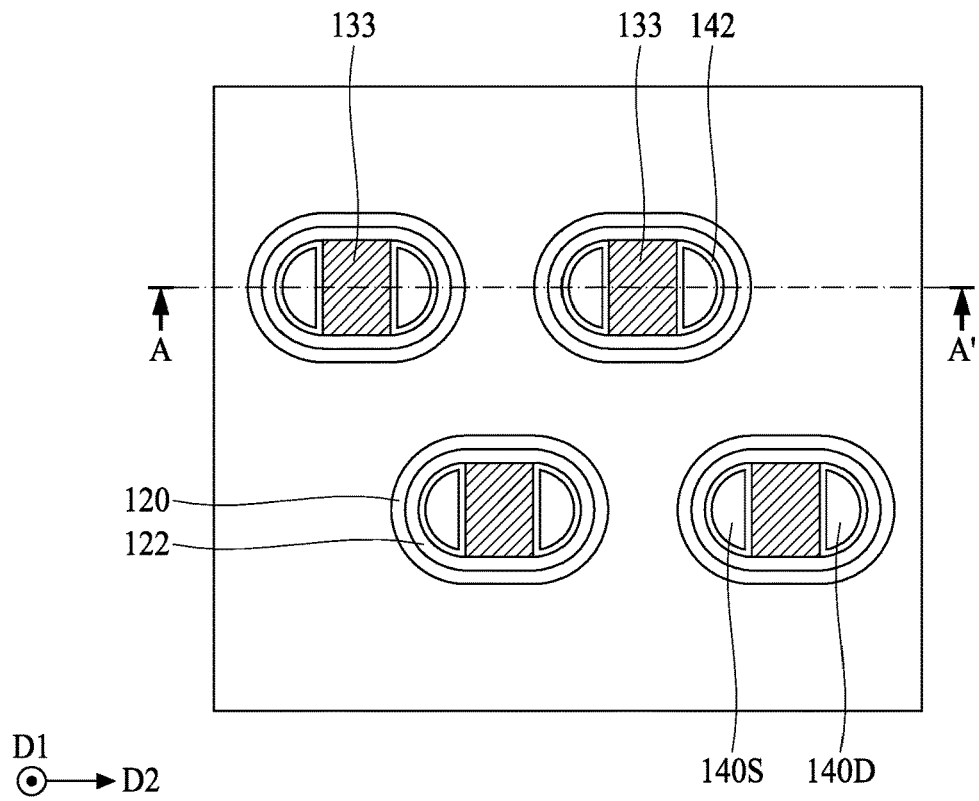
Figure 17B:
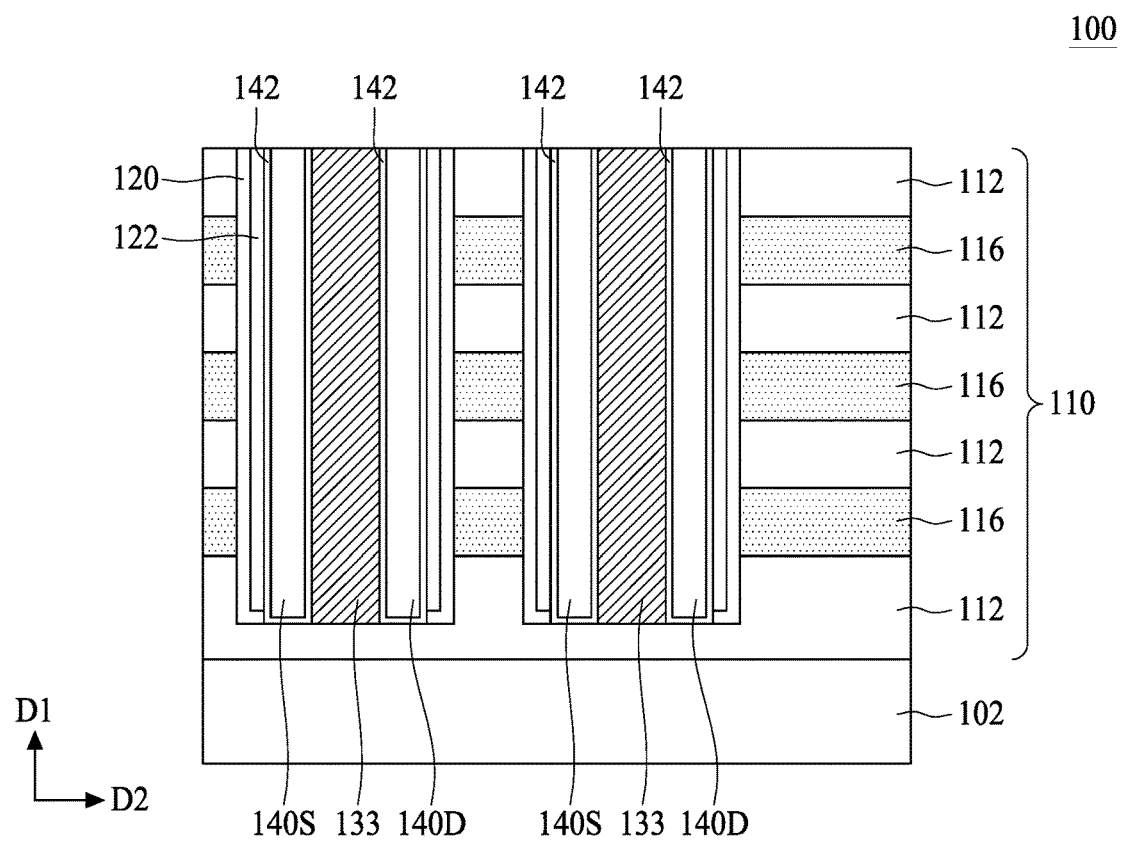

Referring to FIGS. 17A and 17B, in operation 36, a source structure 140S and a drain structure 140D are formed in the recesses 135b at the two sides of the sacrificial layer 133. As mentioned above, a barrier layer 142 can be formed to cover sidewalls and a bottom of each recess 135b, then the recesses 135b are filled with a conductive material. A planarization operation such as a CMP operation is performed to remove superfluous barrier layer and conductive material. Consequently, the source structure 140S and the drain structure 140D are formed at the two sides of each sacrificial layer 133.

Figure 18A:
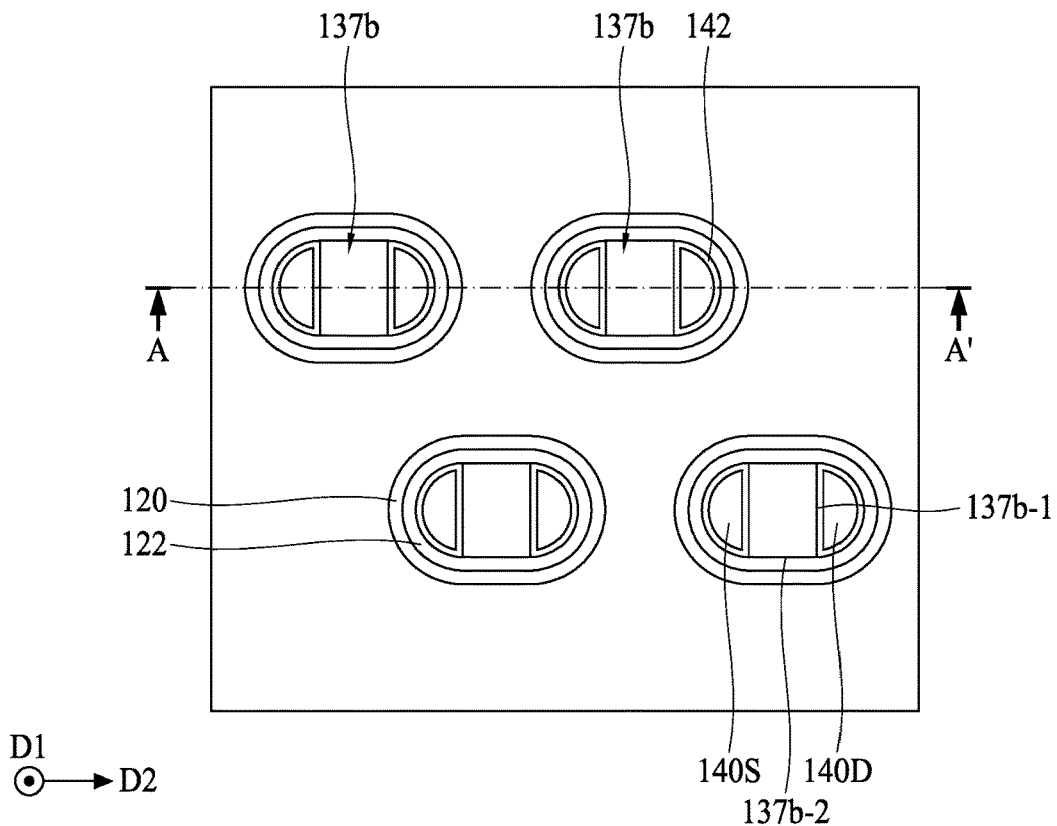
Figure 18B:
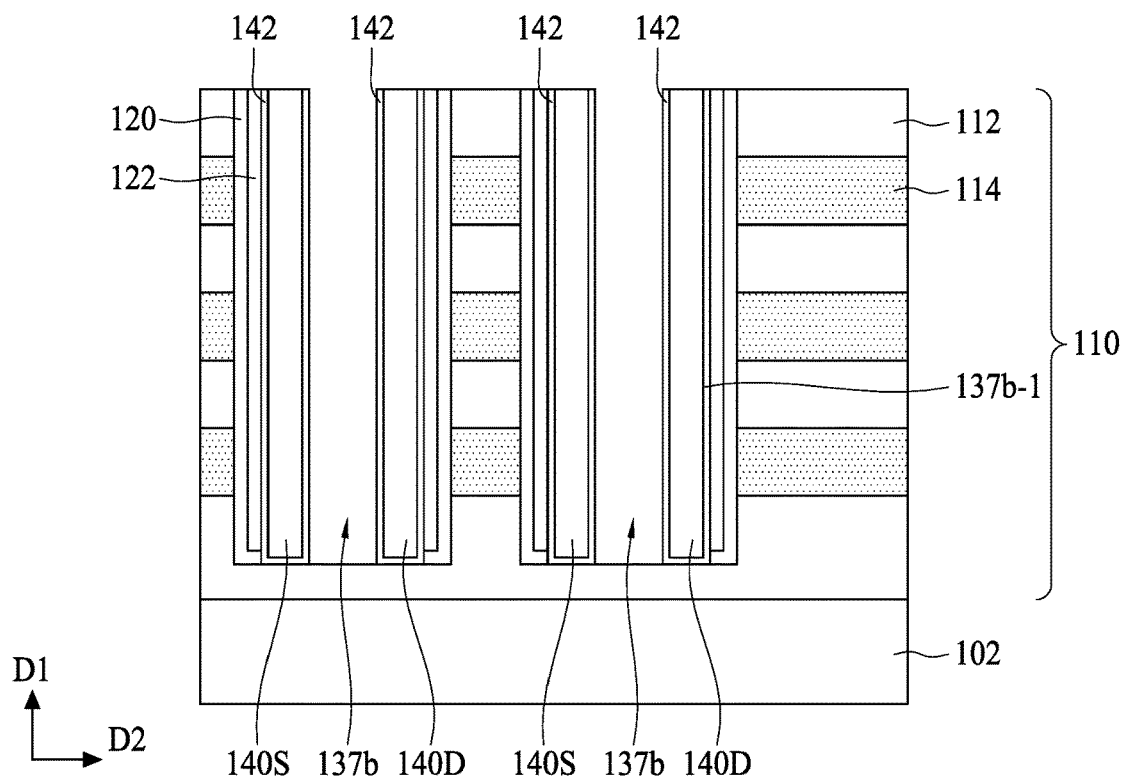

Referring to FIGS. 18A and 18B, in operation 37, a recess 137b is formed between the source structure 140S and the drain structure 140D. In some embodiments, the remaining sacrificial layer 133 is removed, thus the recess 137b are formed between the source structure 140S and the drain structure 140D. In some embodiments, the recess 137b may include a pair of first sidewalls 137b-1 and a pair of second sidewalls 137b-2. In some embodiments, the barrier layer 142 may be exposed through the pair of first sidewalls 137b-1 while the channel layer 122 may be exposed through the pair of second sidewalls 137b-2, as shown in FIG. 18A. In some embodiments, the first layer 112 of the stack 110, such as the bottom most first layer 112 of the stack 110 may be exposed through a bottom of the recess 137b, as shown in FIG. 18B.

Figure 19A:
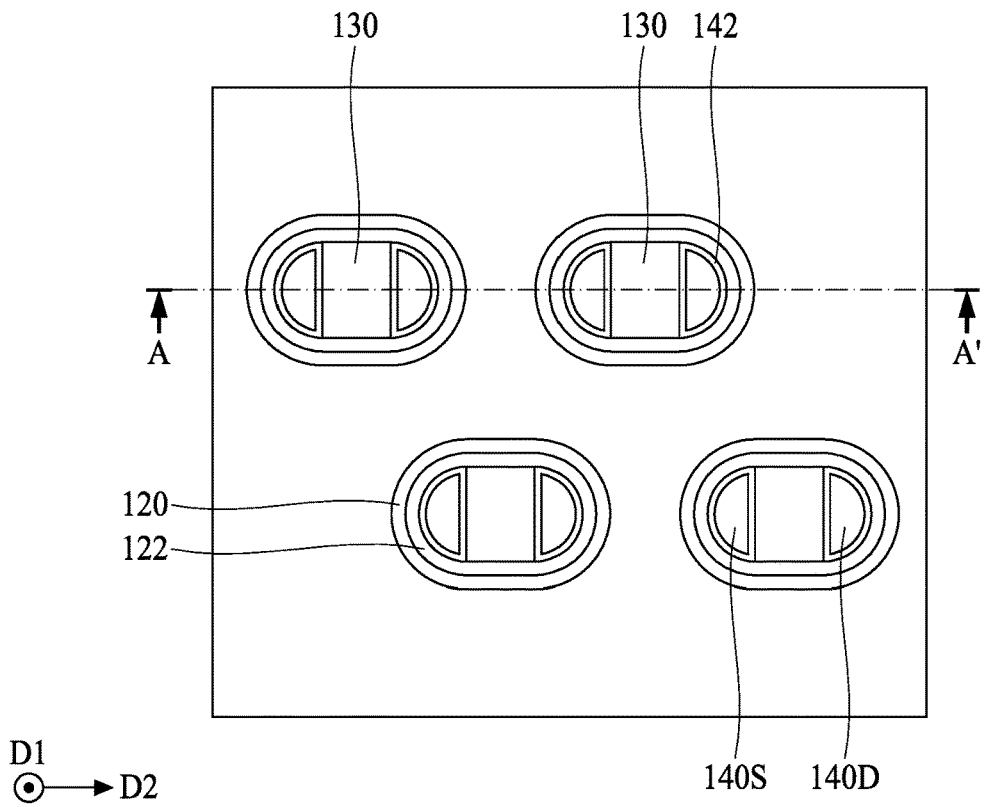
Figure 19B:
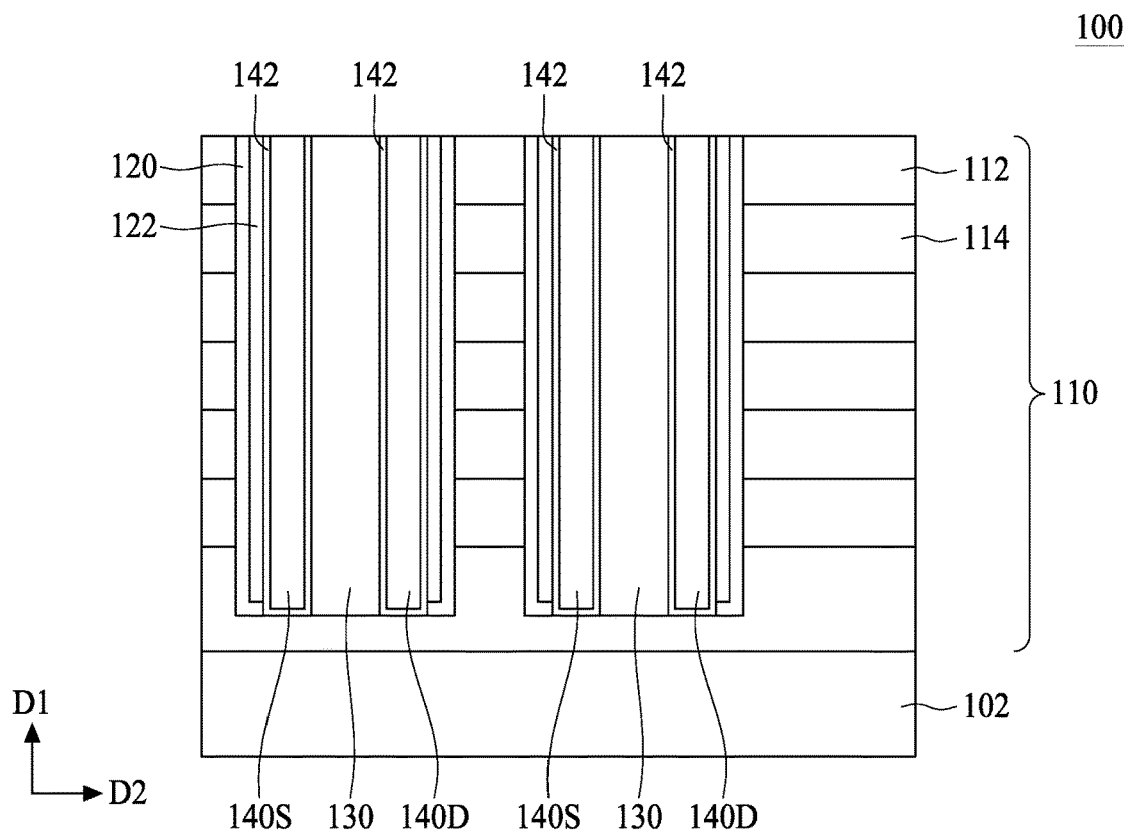

Referring to FIGS. 19A and 19B, in operation 38, an isolation structure 130 is formed in the recess 137b. In some embodiments, the recess 137b is filled with a dielectric material, and a planarization operation such as CMP operation is performed to remove superfluous dielectric material. Accordingly, a top surface of the isolation structure 130 and the top surface of the stack 110 (i.e., the top surface of the topmost first layer 112) can be aligned with each other. Materials for forming the isolation structure 130 can be similar as mentioned above; therefore, those details are omitted for brevity.

In some embodiments, when the second layers 114 include the semiconductor material, the second layers 114 can serve as gate layers for the semiconductor memory structure 100, as shown in FIGS. 19A and 19B. Additionally, operations for forming conductive features such as conductive vias and conductive lines can be performed after the forming of the source structure 140S and the drain structure 140D.

According to the method for forming the semiconductor memory structure 30, a 3D semiconductor memory structure 100 can be obtained. Further, the semiconductor memory structure 100 formed by the method 30 is a 3D semiconductor memory structure. Further, the recesses 137b, which accommodates the isolation structure 130, can be self-aligned formed according to the method 30.

Figure 20A:
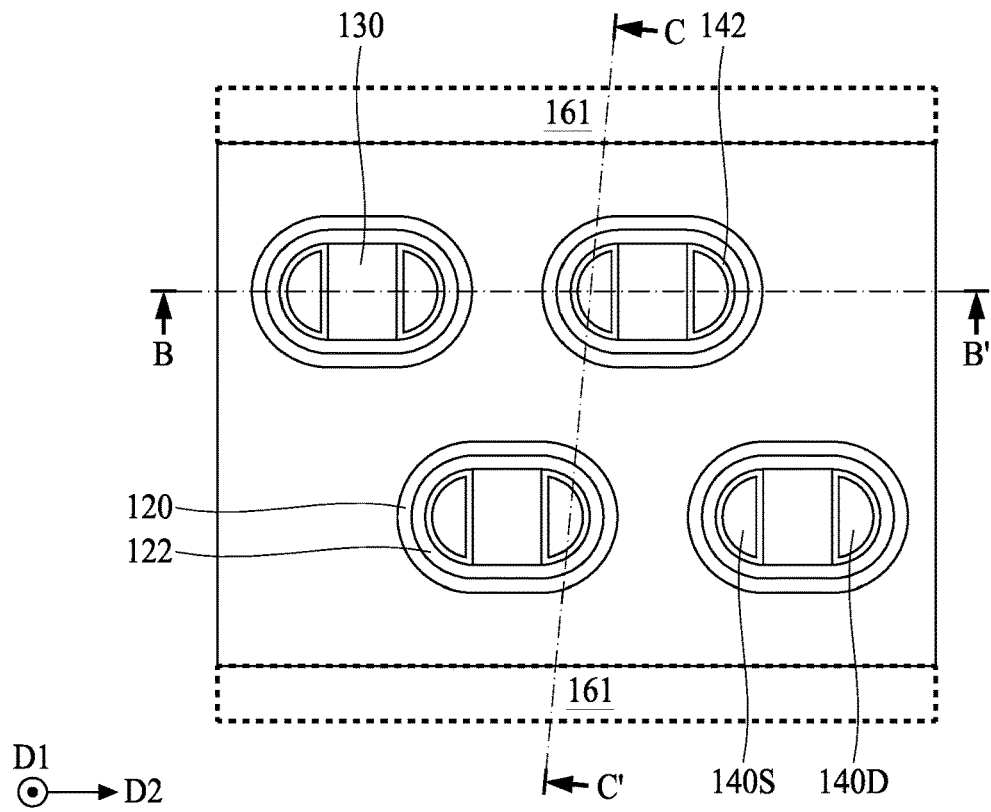
FIGS. 20A, 21A, 22A and 23 are schematic drawings illustrating various stages in a method for forming a semiconductor memory structure according to aspects of one or more embodiments of the present disclosure.
Figure 20B:
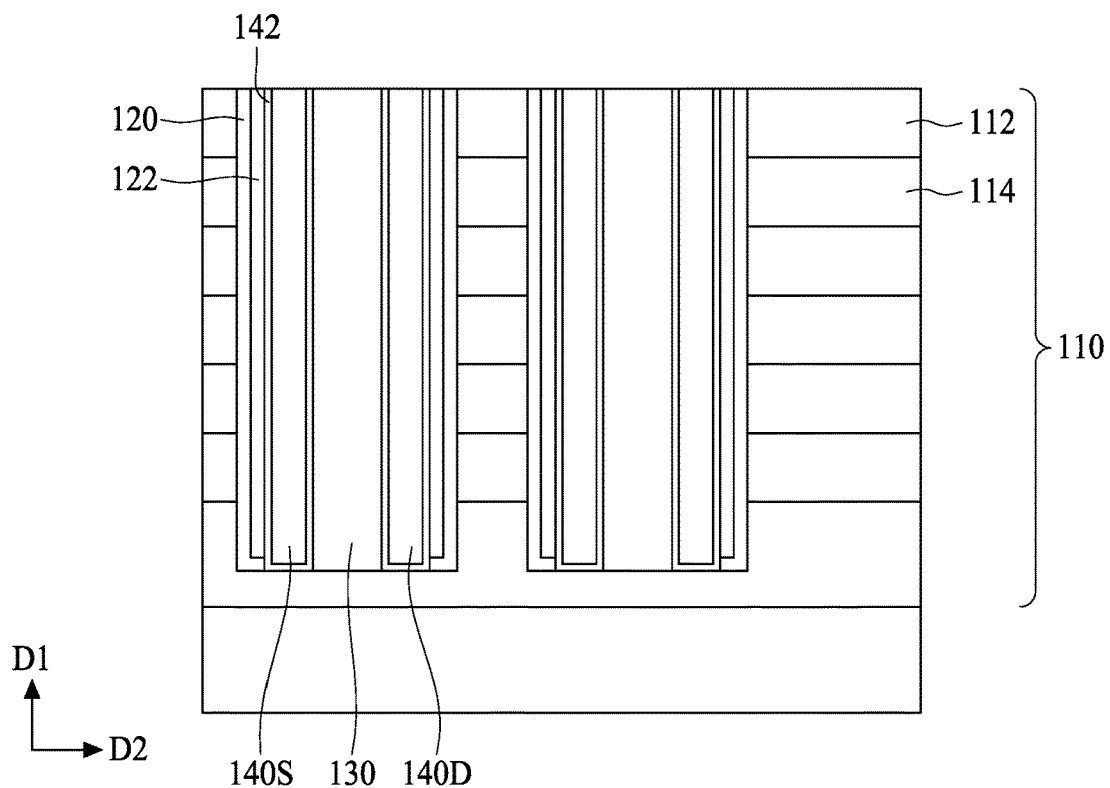
FIGS. 20B, 21B and 22B are cross-sectional views taken along line B-B' in FIGS. 20A, 21A and 22A, respectively.
Figure 20C:
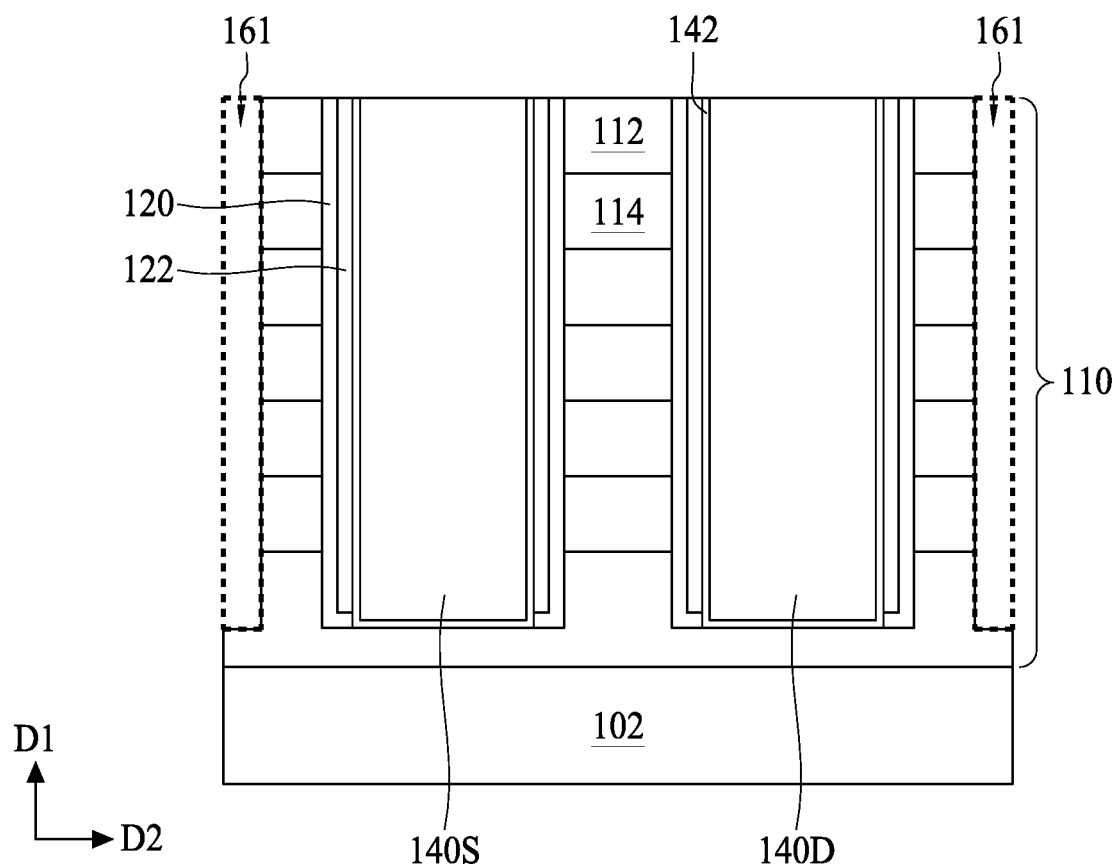
FIGS. 20C, 21C and 22C are cross-sectional views taken along line C-C' in FIGS. 20A, 21A and 22A, respectively.
Figure 21A:
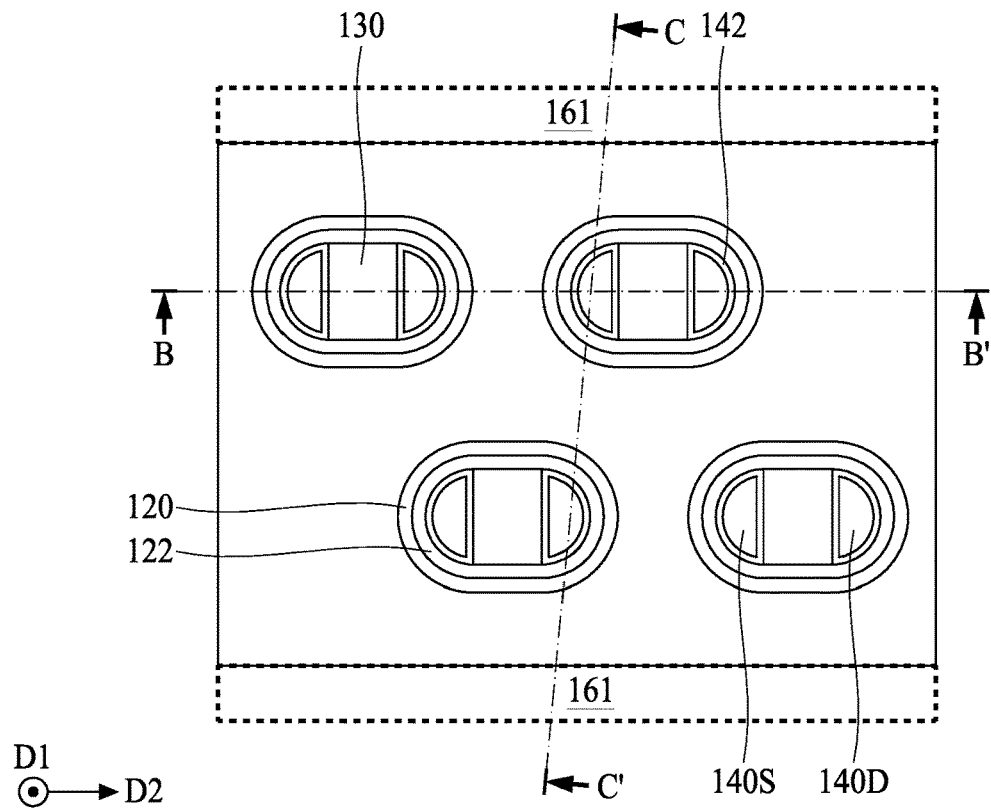
Figure 21B:
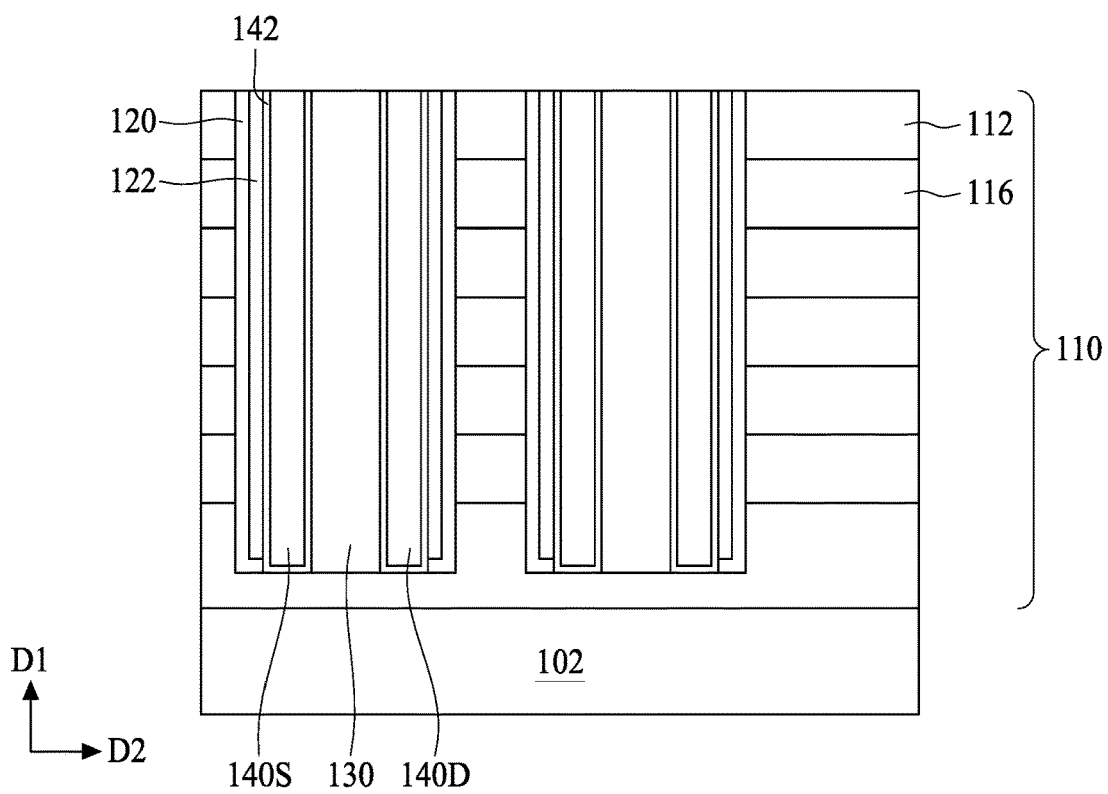
Figure 21C:
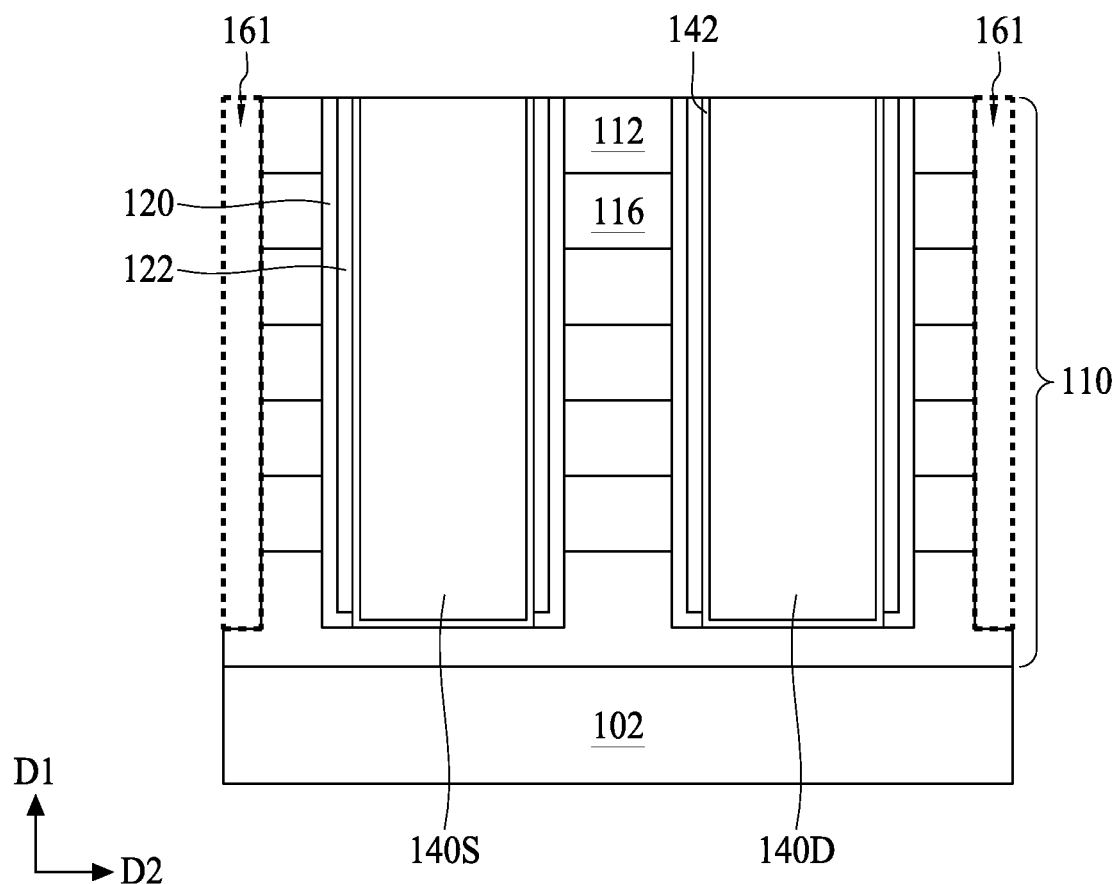
Figure 22A:
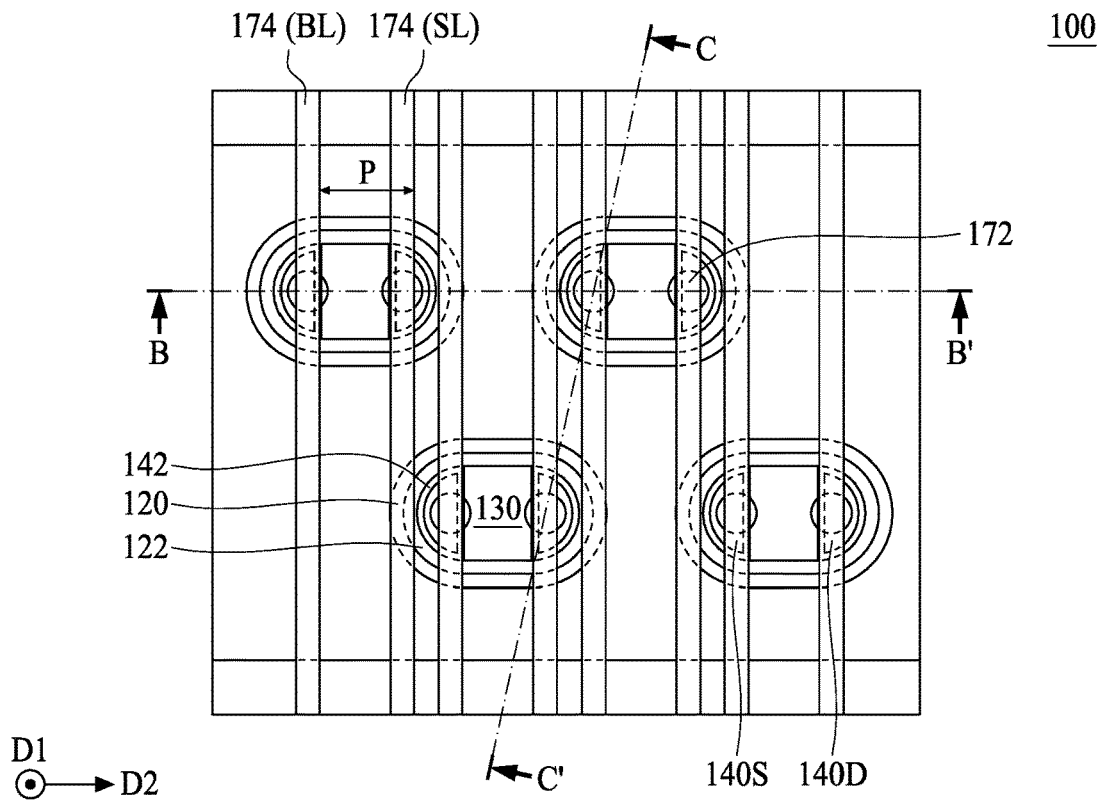
Figure 22B:
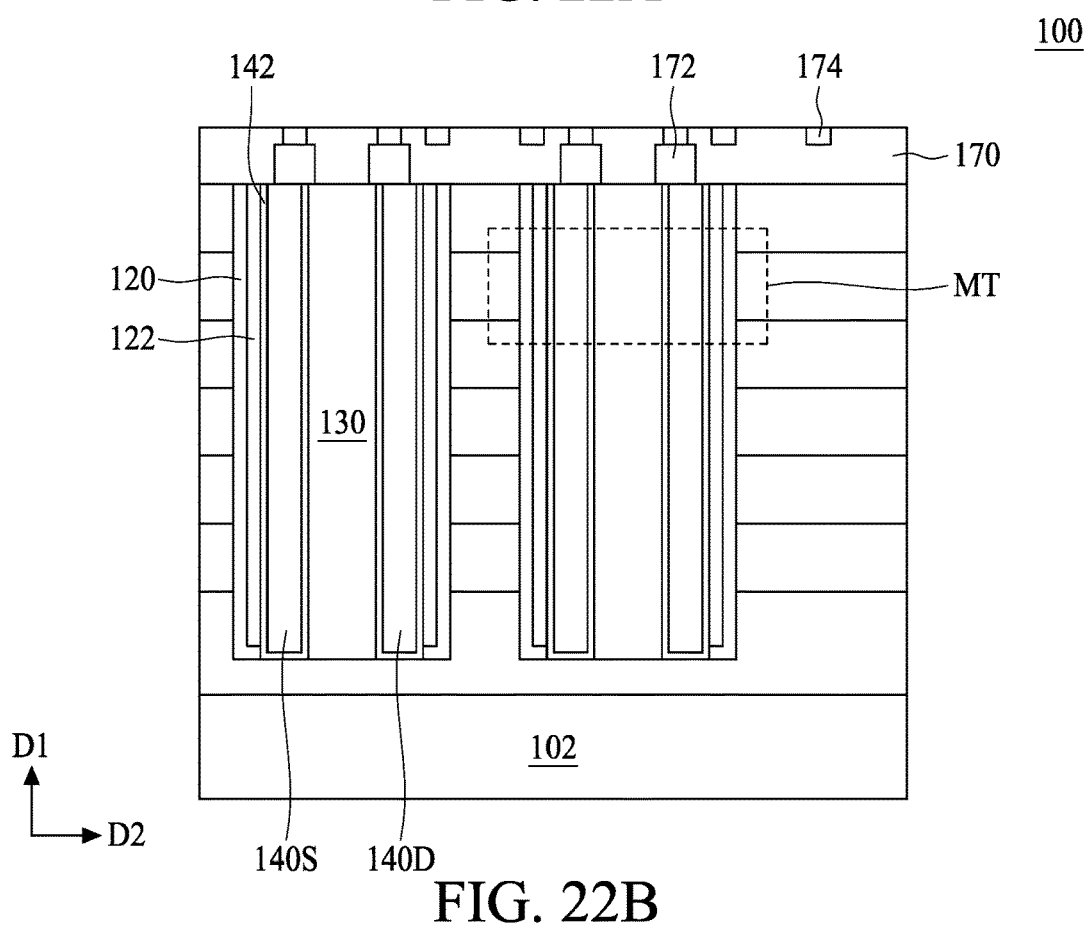
Figure 22C:
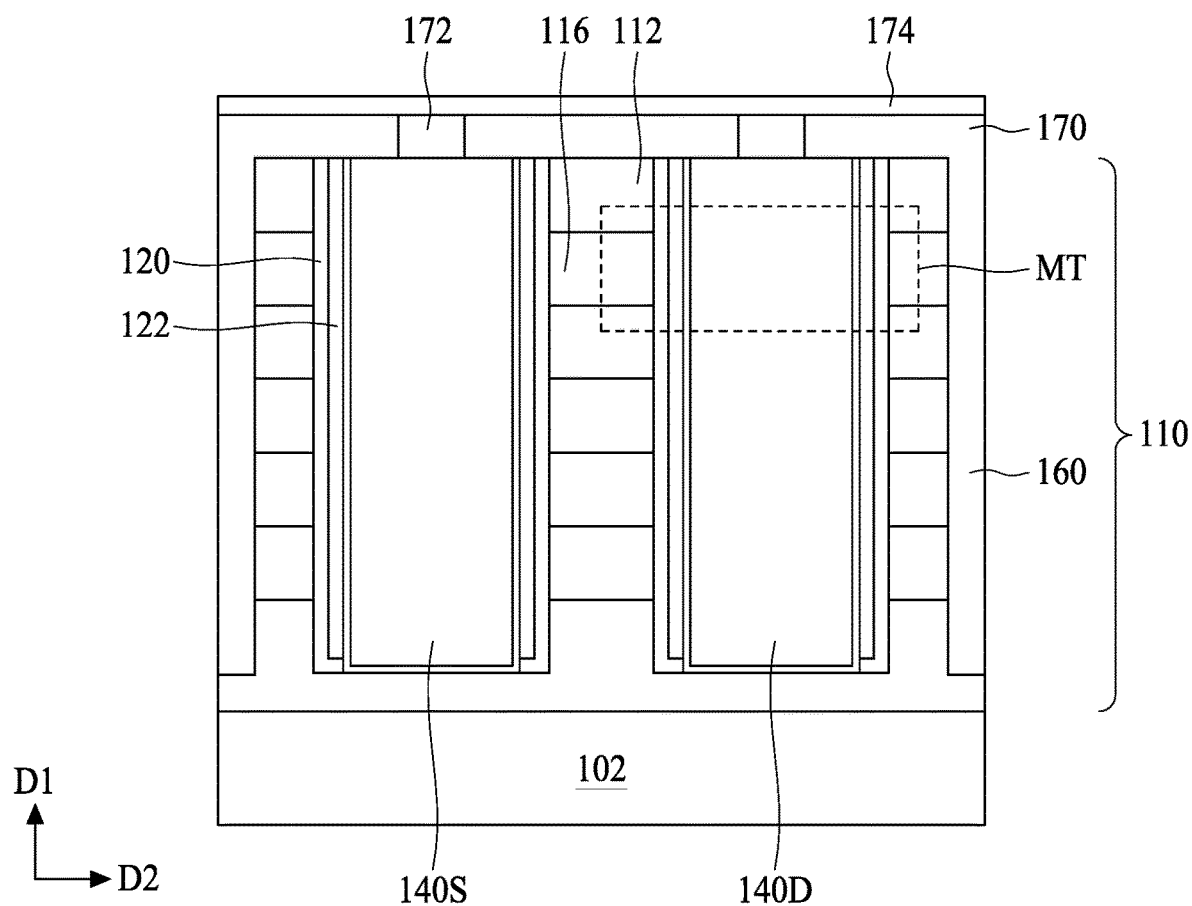

FIGS. 20A, 21A and 22A are schematic drawings illustrating various stages in a method for forming a semiconductor memory structure according to aspects of one or more embodiments of the present disclosure. FIGS. 20B, 21B and 22B are cross-sectional views taken along line B-B' in FIGS. 20A, 21A and 22A, respectively, and FIGS. 20C, 21C and 22C are cross-sectional views taken along line C-C' in FIGS. 20A, 21A and 22A, respectively. In some embodiments, FIGS. 20A to 22A, 20B to 22B and 20C to 22C may be performed after performing operations associated with FIGS. 8A and 8B, 14A and 14B, and 19A and 19B. It should be noted that same elements are indicated by the same numerals, and repeated descriptions of those elements can be omitted for brevity.

As mentioned above, the first layers 112 and the second layers 114 may include different insulating materials. In such embodiments, the second layers 114 are replaced with a conductive material.

As shown in FIGS. 20A, 20B and 20C, in some embodiments, the removal of the second layers 114 may include forming a slit 161 on two sides of an array formed by the semiconductor memory structure 100. As shown in FIG. 20C, the slit 161 may perpendicularly penetrates the stack 110, thus the first layers 112 and the second layers 114 are exposed through sidewalls of the slit 161. Further, the bottom most first layer 112 may be exposed through a bottom of the slit 161. In some embodiments, an etchant which has a higher selectivity for the second layers 114 than the first layers 112 can be introduced into the slits 161. Accordingly, the second layers 114 are removed to form recesses between the first layers, though not shown.

Referring to FIGS. 21A, 21B and 21C, the recesses between the first layers 112 are filled with a conductive material to form a plurality of gate layers 116 along a direction parallel with surfaces of the first layer 112. In some embodiments, the conductive material may include titanium nitride and tungsten (TiN/W), titanium nitride and copper (TiN/Cu), tantalum nitride and copper (TaN/Cu), cobalt and tungsten (Co/W), ruthenium (Ru), or other suitable conductive materials.

Referring to FIGS. 22A, 22B and 22C, in some embodiments, the slits 161 are filled with a dielectric structure 160. In some embodiment, another dielectric structure 170 can be formed over the substrate 102. Materials for forming the dielectric structures 160 and 170 can be similar as mentioned above, therefore those details are omitted. Further, in some embodiments, the dielectric structures 160 and 170 can include a same dielectric material. In some alternative embodiments, the dielectric structures 160 and 170 can include different dielectric materials. In some embodiments, conductive vias 172 and conductive lines 174 are formed in the dielectric structure 170. The conductive vias 172 and the conductive lines 174 can include titanium and titanium nitride (Ti/TiN), tantalum nitride and tungsten (TaN/W), polysilicon, or other suitable material. Further, the conductive vias 172 are coupled to the source structure 140S and the drain structure 140D, respectively. Accordingly, each source structure 140S can be coupled to a conductive line 174, which such serves as a bit line (BL), by the conductive via 172. Each drain structure 140D can be coupled to a conductive line 174, which serves as a select line (SL), by the conductive via 172.

Figure 23:
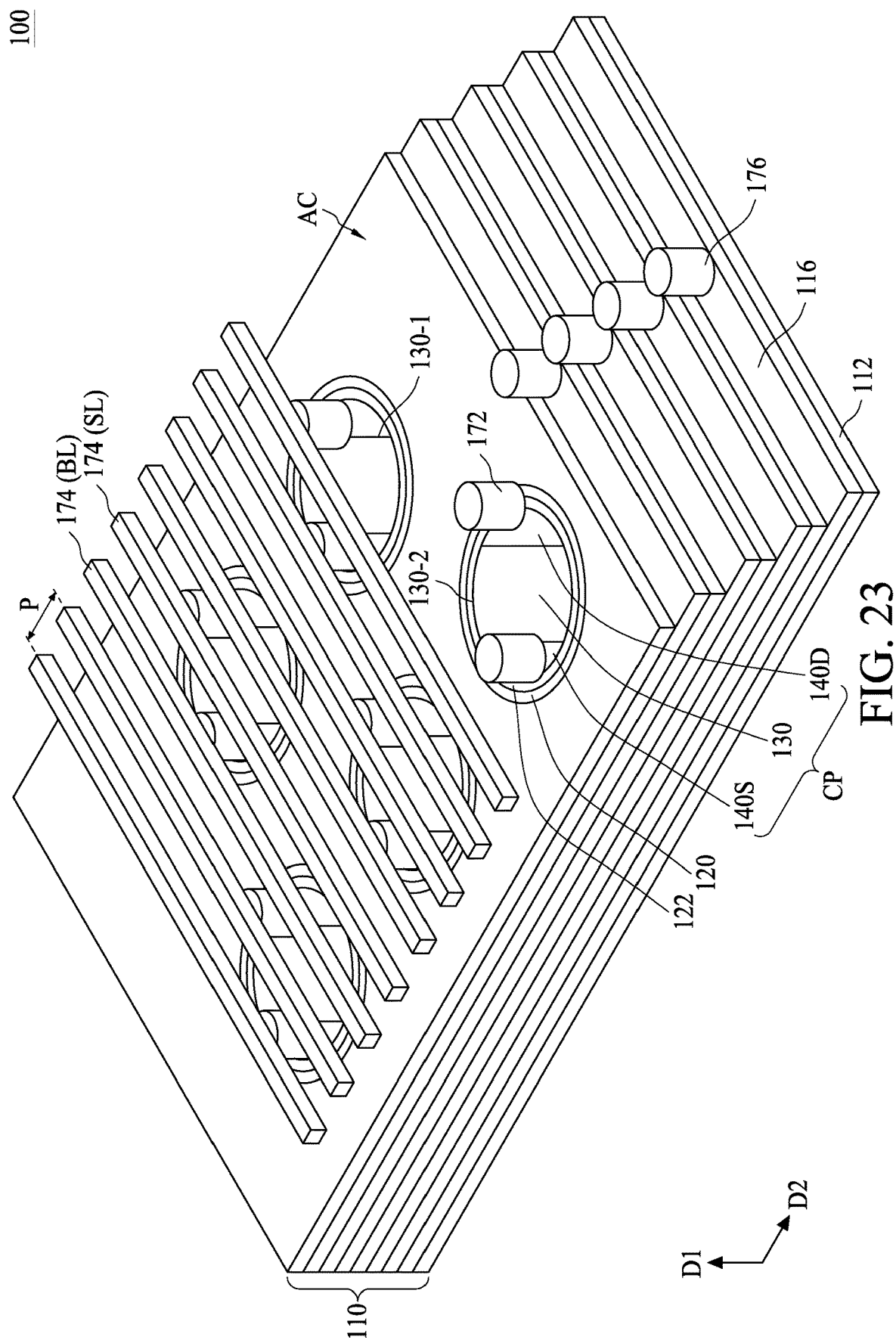

Additionally, the gate layers 116 may serve as word lines (WLs) and may include a staircase configuration, and conductive vias 176 may be formed over each gate layer 116, as shown in FIG. 23.

Referring to FIGS. 22A, 22B, 22C and 23, accordingly, in some embodiments, the semiconductor memory structure 100 is provided. The semiconductor memory structure 100 includes a plurality of gate layers 116, and a plurality of insulating layers 112 alternately stacked over a substrate 102 along a first direction D1. In some embodiments, the first direction D1 is substantially perpendicular to a surface of the substrate 102. Further, the gate layers 116 and the insulating layers 112 are extended along a second direction D2 perpendicular to the first direction D1. In some embodiments, the second direction D2 is substantially parallel with a surface of the substrate 202. A thickness of the insulating layers 112 can be between approximately 250 Angstroms and approximately 1000 Angstroms, and a thickness of the gate layers 116 can be between approximately 250 Angstroms and approximately 1000 Angstroms. It should be noted that the thickness of the insulating layers 112 and the thickness of the gate layers 116 can be similar or different, depending on different product requirements. In some embodiments, the thickness of the insulating layer 112 and the thickness of the gate layer 114 have a ratio, and the ratio is between approximately 0.1 and approximately 10.

The semiconductor memory structure 100 further includes at least an active column AC disposed over the substrate 102 and extending along the first direction D1. As shown in FIGS. 22B, 22C and 23, the active column AC may perpendicularly penetrates the gate layer 116 and the insulating layer 112. However, as shown in FIGS. 22B and 22C, the active column AC is separated from the substrate 102 by the bottom most insulating layer 112 of the stack 110. As mentioned above, a number of the active column AC can be made as high as the number of they needed. In some embodiments, the active columns AC can be arranged in an array configuration of rows and columns or in a staggered array configuration. Additionally, as shown in FIGS. 24A to 24D, a shape of the active columns AC can be made as rectangular, rhombus, oval, or circular, according to different product or design requirements.

In some embodiments, the active column AC includes a central portion CP, a charge-trapping layer 120 surrounding the central portion CP, and a channel layer 122 between the charge-trapping layer 120 and the central portion CP. Further, the central portion CP includes an isolation structure 130, a source structure 140S and a drain structure 140D. Materials for forming the charge-trapping layer 120 and the channel layer 122 can be similar as mentioned above; therefore, those details are omitted for brevity.

As shown in FIG. 23, the isolation structure 130 of the central portion CP of the active column AC may include a pair of first sides 130-1 and a pair of second side 130-2, and the source structure 140S and the drain structure 140D are disposed at the pair of first sides 130-1. In some embodiments, the first sides 130-1 of the isolation structures 130 can be parallel with each other, but the disclosure is not limited thereto. Further, the channel layer 122 is disposed at the pair of second sides 130-2 of the isolation structure 130. In some embodiments, the channel layer 122 in contact with the pair of second sides 130-2 of the isolation structure 130.

The semiconductor memory structure 100 further includes a plurality of conductive vias 172 coupled to the source structure 140S and the drain structure 140D, respectively. Further, the semiconductor memory structure 100 includes a plurality of conductive lines 174. As mentioned above, the source structures 140S are electrically connected to conductive lines 174 serving as bit lines BL by the conductive vias 172, while the drain structures 140D are electrically connected to conductive lines 174 serving as select lines SL by the conductive vias 172. As shown in FIGS. 22B, 22C and 23, heights of the conductive vias 172 are the same, and the bit lines 174(BL) and the select lines 174(SL) are parallel with each other and in a same layer. Further, the bit lines 174(BL) and the select lines 174(SL) are alternately arranged along the second direction D2.

In some embodiments, a shortest distance between the source structure 140S and the drain structure 140D can be determined by a pitch P between the bit line 174(BL) and its neighboring select line 174(SL). A pitch specifies a sum of the width of a feature and the space on one side of the feature separating that feature from a neighboring feature. In some embodiments, by selecting shape for the active column AC, arranging the active columns AC and rotating the active columns AC, the pitch P between the bit line 174(BL) and the neighboring select line 174(SL) can be adjusted to comply different product requirements and/or design requirements. In some embodiments, the pitch P between adjacent bit line 174(BL) and the select line 174(SL) is between approximately 20 nanometers and 500 nanometers, but the disclosure is not limited thereto.

In some embodiment, each active column AC includes a plurality of memory devices MT. Further, each memory device MT includes a gate layer 116, and a source structure 140S and a drain structure 140D surrounding by that gate layer 116. In some embodiments, it can be referred to as a gate layer 116, a source structure 140S and a drain structure 140D in substantially same plane form a memory device MT, as shown in FIGS. 22B and 22C. Further, channels are formed in the channel layer 122 at the pair of second sides 130-2 of the isolation structure 130. Accordingly, the memory device MT can be referred to as a dual-channel memory transistor MT.

In some embodiments, each active column AC includes a plurality of dual-channel memory transistors MT. As shown in FIGS. 22A, 22B and 22C, the source structure 140S and the drain structure 140D respectively penetrate the stack 110. Therefore, it can be referred to that the source structures 140S of the dual-channel memory transistors MT in one active column AC are in series-connected, and the drain structures 140D of the dual-channel memory transistors MT in one active column AC are in series-connected. Further, the same gate layer 116 of each dual-channel memory transistor MT in the same plane are in parallel-connected, as shown in FIG. 23.

Consequently, the semiconductor memory structure 100 includes the plurality of active columns AC, which include the plurality of memory devices MT stacked in 3D configuration. The 3D configuration helps to increase cell densities. Further, the electrical connections allow the semiconductor memory structure 100 work as a NOR-type flash memory.

Accordingly, the present disclosure therefore provides a semiconductor memory structure and a method for forming the same that complies with both the high read/write access speed requirement and the high density requirement. In some embodiments, the semiconductor memory structure in a NOR-type flash memory structure that provides greater read/write access speed as good as a dynamic random access memory (DRAM). Further, the semiconductor memory structure includes a 3D configuration that complies with the high-density requirement as good as NAND-type memory.

In some embodiments, a semiconductor memory structure is provided. The semiconductor memory structure includes a plurality of gate layers and a plurality of insulating layers alternately stacked over a substrate, and at least an active column disposed over the substrate. The gate layers and the insulating layers are alternately stacked along a first direction. The active column extends along the first direction and penetrates the gate layer and the insulating layer. The active column includes a central portion, a charge-trapping layer surrounding the central portion, and a channel layer between the central portion and the charge-trapping layer. The central portion of the active column includes an isolation structure, a source structure and a drain structure. In some embodiments, the source structure and the drain structure are disposed at two sides of the isolation structure.

In some embodiments, a semiconductor memory structure is provided. The semiconductor memory structure includes a plurality of gate layers and a plurality of insulating layers alternately stacked over a substrate, a plurality of active columns disposed over the substrate, a plurality of first conductive lines and a plurality of second conductive lines. The gate layers and the insulating layers are stacked along a direction substantially perpendicular to a surface of the substrate. The active columns extend along the direction, and penetrate the gate layer and the insulating layers. Each of the active columns includes a central portion, a charge-trapping layer surrounding the central portion, and a channel layer between the central portion and the charge-trapping layer. The central portion of each active column includes an isolation structure, a source structure and a drain structure.

In some embodiments, the source structure and the drain structure are disposed at two sides of the isolation structure. The first conductive lines are respectively coupled to the source structures of the active columns, and the second conductive lines are respectively coupled to the drain structures of the active columns.

In some embodiments, a method for forming a semiconductor memory structure is provided. The method include following operations. A stack including a plurality of first layers and a plurality of second layer alternately arranged is formed over a substrate. A trench is formed in the stack. A charge-trapping layer ad a channel layer covering sidewalls and a bottom of the trench is formed. An isolation structure is formed in the trench. A source structure and a drain structure are formed at two sides of the isolation structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor memory structure comprising:
    a plurality of gate layers and a plurality of insulating layers alternately stacked over a substrate along a first direction; and
    at least one active column disposed over the substrate and extending along the first direction, wherein the at least one active column penetrates the gate layers and the insulating layers, and comprises:
        a central portion comprising an isolation structure, a source structure and a drain structure, wherein the source structure and the drain structure are disposed at two sides of the isolation structure;
        a charge-trapping layer surrounding the central portion;
        a channel layer between the charge-trapping layer and the central portion;
        a first barrier layer between the source structure and the channel layer, wherein a bottom surface of the source structure is in contact with the first barrier layer; and
        a second barrier layer between the drain structure and the channel layer, wherein a bottom surface of the drain structure is in contact with the second barrier layer.

2. The semiconductor memory structure of claim 1, wherein the plurality of gate layers and the plurality of insulating layers are extended along a second direction perpendicular to the first direction, and the second direction is substantially parallel with a surface of the substrate.

3. The semiconductor memory structure of claim 1, wherein the charge trapping layer comprises an oxide-nitride-oxide (ONO) structure or a ferroelectric structure.

4. The semiconductor memory structure of claim 1, wherein the isolation structure of the central portion of the at least one active column comprises a pair of first sides and a pair of second sides, and the source structure and the drain structure are disposed at the pair of first sides.

5. The semiconductor memory structure of claim 4, wherein the channel layer is disposed at the pair of second sides of the isolation structure.

6. The semiconductor memory structure of claim 1, wherein a first thickness of the plurality of gate layers and a second thickness of the plurality of insulating layers have a ratio, and the ratio is between approximately 0.1 and approximately 10.

7. The semiconductor memory structure of claim 1, wherein the first barrier layer is between the source structure and the isolation structure, and the second barrier layer is between drain structure and the isolation structure.

8. The semiconductor memory structure of claim 1, further comprising a first conductive line coupled to the source structure, and a second conductive line coupled to the drain structure.

9. The semiconductor memory structure of claim 8, wherein the first conductive line and the second conductive line are parallel with each other.

10. The semiconductor memory structure of claim 1, wherein the first barrier layer and the second barrier layer respectively comprise a metal or a metal nitride.

11. A semiconductor memory structure comprising:
    a plurality of gate layers and a plurality of insulating layers alternately stacked over a substrate along a direction substantially perpendicular to a surface of the substrate;
    a plurality of active columns disposed over the substrate and extending along the direction, wherein each of the plurality of active columns penetrates the gate layers and the insulating layers, and comprises:
        a central portion comprising an isolation structure, a source structure and a drain structure, wherein the source structure and the drain structure are disposed at two sides of the isolation structure;
        a charge-trapping layer surrounding the central portion; and
        a channel layer disposed between the charge-trapping layer and the central portion;
    a plurality of first conductive lines respectively coupled to the source structures of the plurality of active columns; and
    a plurality second conductive lines respectively coupled to the drain structures of the plurality of active columns,
wherein each of the isolation structures of the central portions of the plurality of active columns comprises a pair of first sides and a pair of second sides, and the first sides of the isolation structures are parallel with each other.

12. The semiconductor memory structure of claim 11, wherein the plurality of first conductive lines and the plurality of second conductive lines are parallel with each other and in a same layer.

13. The semiconductor memory structure of claim 11, wherein the plurality of first conductive lines and the plurality of second conductive lines are alternately arranged.

14. The semiconductor memory structure of claim 11, further comprising:
    a plurality of first conductive vias electrically connecting the source structures of the plurality of active columns to the plurality of first conductive lines; and
    a plurality of second conductive vias electrically connecting the drain structures of the plurality of active columns to the plurality of second conductive lines,
    wherein a height of the plurality of first conductive vias and a height of the plurality of second conductive vias are the same.

15. The semiconductor memory structure of claim 14, further comprising a plurality of third conductive vias respectively coupled to the plurality of gate layers, wherein heights of the third conductive vias are different from each other.

16. The semiconductor memory structure of claim 11, wherein the source structure and the drain structure are disposed at the pair of first sides of the isolation structure, and the channel layer is disposed at the pair of second sides of the isolation structure.

17. A method for forming a semiconductor memory structure, comprising:
    forming a stack comprising a plurality of first layers and a plurality of second layers alternately arranged over a substrate;
    forming at least one trench in the stack;
    forming a charge-trapping layer and a channel layer covering sidewalls and a bottom of the at least one trench;
    filling the at least one trench with a sacrificial layer;
    removing portions of the sacrificial layer to form first recesses;
    forming a source structure and a drain structure in the first recesses;
    removing the sacrificial layer to form a second recess between the source structure and the drain structure; and
    forming an isolation structure in the second recess.

18. The method of claim 17, wherein the plurality of first layers comprise insulating materials and the plurality of second layers comprise semiconductor materials or conductive materials.

19. The method of claim 17, wherein the plurality of first layers comprise a first insulating material and the plurality of second layers comprise a second insulating material different from the first insulating material.

20. The method of claim 19, further comprising replacing the plurality of second layers with conductive layers.

* * * * *